(12) United States Patent
Nakashima et al.

(10) Patent No.: US 10,461,731 B2
(45) Date of Patent: Oct. 29, 2019

(54) POWER SUPPLY DEVICE

(71) Applicant: ULVAC, INC., Chigasaki-shi, Kanagawa (JP)

(72) Inventors: Kenya Nakashima, Chigasaki (JP); Dougo Oohashi, Chigasaki (JP); Yoshinori Miyano, Chigasaki (JP); Masayuki Kaida, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 0 days.

(21) Appl. No.: 16/214,953

(22) Filed: Dec. 10, 2018

(65) Prior Publication Data

US 2019/0123733 A1 Apr. 25, 2019

Related U.S. Application Data

(63) Continuation of application No. PCT/JP2017/033905, filed on Sep. 20, 2017.

(30) Foreign Application Priority Data

Sep. 30, 2016 (JP) .................................. 2016-193785

(51) Int. Cl.
*H03K 17/0812* (2006.01)
*H02H 9/02* (2006.01)
(Continued)

(52) U.S. Cl.
CPC ......... *H03K 17/08122* (2013.01); *H02H 9/02* (2013.01); *H02J 7/0052* (2013.01);
(Continued)

(58) Field of Classification Search
CPC ........................... H03K 17/08122; H02H 9/02
See application file for complete search history.

(56) References Cited

U.S. PATENT DOCUMENTS

| 2,979,677 A | 4/1961 | Clark |
| 4,047,120 A | 9/1977 | Lord et al. |

(Continued)

FOREIGN PATENT DOCUMENTS

| JP | S58-66832 U | 5/1983 |
| JP | S60-59745 U | 4/1985 |

(Continued)

OTHER PUBLICATIONS

Nov. 7, 2017 International Search Report issued in Japanese Application No. PCT/JP2017/033905.
(Continued)

*Primary Examiner* — Scott Bauer
(74) *Attorney, Agent, or Firm* — Oliff PLC

(57) ABSTRACT

A current fluctuating due to a load fluctuation is limited to protect a semiconductor switch. A protection circuit includes a switch circuit that turns on when a predetermined conduction voltage is applied thereto, and a sub-reactance circuit having a predetermined reactance value is connected in parallel to a main reactance circuit through which a high frequency current generated by a semiconductor switch flows. When the switch circuit is turned on, the main reactance circuit and the sub-reactance circuit are connected in parallel, and a high frequency current flows through this parallel connection circuit. The impedance value of the parallel connection circuit is set to be larger than the impedance value of the main reactance circuit so that the current is limited due to the turning on of the switch circuit, and thus, the semiconductor switch is protected.

4 Claims, 23 Drawing Sheets

(51) Int. Cl.
*H02J 7/00* (2006.01)
*H03F 1/52* (2006.01)
*H03F 3/193* (2006.01)
*H02J 7/34* (2006.01)

(52) U.S. Cl.
CPC .............. *H03F 1/523* (2013.01); *H03F 3/193* (2013.01); *H02J 7/345* (2013.01); *H03F 2200/267* (2013.01); *H03F 2200/426* (2013.01); *H03F 2200/451* (2013.01)

(56) References Cited

U.S. PATENT DOCUMENTS

| | | | |
|---|---|---|---|
| 4,719,556 A | 1/1988 | Wise | |
| 5,810,982 A * | 9/1998 | Sellers | C23C 14/0036 204/192.12 |
| 6,072,362 A | 6/2000 | Lincoln | |
| 6,416,638 B1 * | 7/2002 | Kuriyama | C23C 14/54 204/192.13 |
| 8,730,640 B2 * | 5/2014 | Penwell | H01P 1/20 361/118 |
| 2004/0124077 A1 * | 7/2004 | Christie | H01J 37/34 204/192.12 |
| 2009/0160417 A1 * | 6/2009 | Klimczak | H01J 37/3444 323/305 |

FOREIGN PATENT DOCUMENTS

| | | |
|---|---|---|
| JP | 2628634 B2 | 7/1997 |
| JP | 2001-509357 A | 7/2001 |
| JP | 2004-350337 A | 12/2004 |
| JP | 4972411 B2 | 7/2012 |
| JP | 5258836 B2 | 8/2013 |
| JP | 2014-180577 A | 9/2014 |
| JP | 2014-183692 A | 9/2014 |
| JP | 5797313 B1 | 10/2015 |

OTHER PUBLICATIONS

Apr. 2, 2019 International Preliminary Report on Patentability issued in International Patent Application No. PCT/JP2017/033905.

* cited by examiner

Current limiting circuit impedance adjustment
Diode turning on state

Current limiting circuit impedance
Dependence of protection curcuit diode reactance

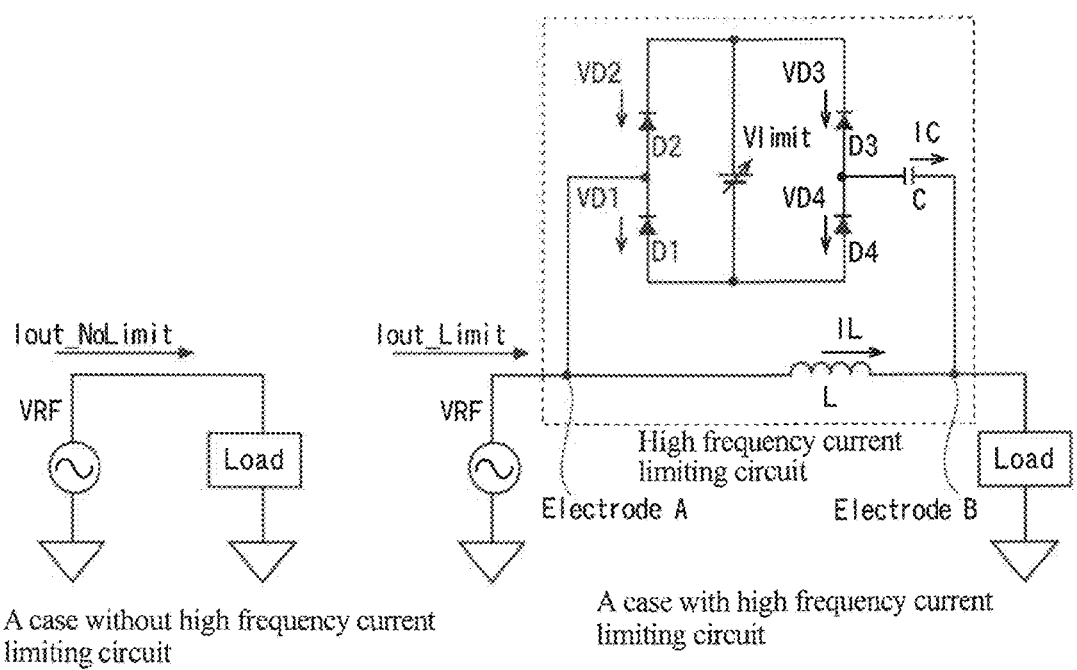
Fig. 13(a) A case without high frequency current limiting circuit
Fig. 13(b) A case with high frequency current limiting circuit An example when main reactance circuit is capacitive.

Protection circuit having half-wave
voltage doubler rectifying circuit

Protection circuit having a transformer-coupled
half-wave voltage doubler rectifying circuit

POWER SUPPLY DEVICE

CROSS-REFERENCE

This application is a continuation of International Application No. PCT/JP2017/033905, filed on Sep. 20, 2017, which claims priority to Japan Patent Application No. 2016-193785, filed on Sep. 30, 2016. The contents of the prior applications are herein incorporated by reference in their entireties.

BACKGROUND

The present invention generally relates to the technical field of a power supply device, and in particular, relates to protection of a semiconductor switch of a high frequency amplifying circuit.

In a high frequency power source for plasma generation, an unexpected change of the plasma density due to abrupt abnormal electric discharge or due to a pulse outputting operation of the high frequency power source may occur in the plasma serving as a load. When this happens, the load impedance seen from the high frequency power source may instantaneously fluctuate to increase the output current or voltage of a high frequency amplifying circuit. Therefore, frequent occurrence of this phenomenon may cause an electric stress on, or may cause breakage of, the high frequency amplifying circuit or an internal element of a high frequency output circuit.

For example, in abnormal electric discharge occurring during plasma processing, a high-frequency output is stopped in several hundreds of nanoseconds after the occurrence of abnormal electric discharge. The plasma energy is then dissipated, and the high frequency power is turned on again thereafter. In this method, the plasma returns from a misfire state to a steady state in several microseconds using several tens of microseconds. If re-ignition of plasma fails, the misfire state continues and the plasma will not return to the steady state. The impedance of the high frequency amplifying circuit would mismatch with the load, and as a result, power loss would occur.

In order to suppress the power loss of the high frequency amplifying circuit, drooping characteristics of the high frequency amplifying circuit may be controlled under the feedback control of the output power. However, in many cases, the response is slow and thus the output power will drop through several hundreds of microseconds to several milliseconds. Therefore, the protection of each element of the high frequency amplifying circuit will not work under the feedback control during the decrease of output power.

If the impedance from the high frequency amplifying circuit to the load is significantly lower than usual, the high frequency amplifying circuit will output the energy several times larger than the normal energy. Therefore, a semiconductor switch of the high frequency amplifying circuit will cause power loss, overvoltage, and/or overcurrent. In attempting to design in consideration of the overvoltage and overcurrent due to the fluctuation of a load impedance, the designer of a high frequency power source has to provide a semiconductor switch having the rating several times higher than the normal semiconductor switch and design a circuit having a high withstanding voltage. Thus, reducing size and reducing component cost are inhibited.

CITATION LIST

Patent Literature

PTL 1: U.S. Pat. No. 2,979,677
PTL 2: U.S. Pat. No. 4,047,120
PTL 3: U.S. Pat. No. 4,719,556
PTL 4: U.S. Pat. No. 6,072,362
PTL 5: Japanese Patent Publication No. 2014-180577
PTL 6: Japanese Patent No. 5258836
PTL 7: Japanese Patent No. 4972411
PTL 8: Japanese Patent No. 2628634
PTL 9: Japanese Patent No. 5797313

SUMMARY

Technical Problem

The subject of the present invention is to provide a power source capable of limiting a high frequency output current in response to load fluctuation, and to provide a power supply device capable of protecting a semiconductor switch in response to load fluctuation.

Solution to Problem

In order to solve the above-described problems, a power supply device is provided including a DC power source to output a DC voltage, a high frequency amplifying circuit to generate a high frequency current by repeatedly turning on and turning off a semiconductor switch connected to the DC power source, a high frequency output circuit to supply the high frequency current to a load, and a main reactance circuit having a predetermined reactance value. The main reactance circuit has one end connected to the high frequency amplifying circuit and the other end connected to the high frequency output circuit. The power supply device further includes a protection circuit connected in parallel to the main reactance circuit between the high frequency amplifying circuit and the high frequency output circuit. The protection circuit includes a DC voltage source that supplies a predetermined reference voltage, a switch circuit that turns on when a turning on voltage larger than the reference voltage is applied, and a sub-reactance circuit having a predetermined reactance value. An absolute value of an impedance of a parallel connection circuit of the protection circuit and the main reactance circuit when the switch circuit turn on is set to be larger than an absolute value of an impedance of the parallel connection circuit of the protection circuit and the main reactance circuit when the switch circuit turn off. In addition, once the switch circuit turned on, an absolute value of an impedance on the load side seen from the high frequency amplifying circuit becomes larger than an absolute value of an impedance when the protection circuit is turned off, so that the high frequency current is limited. The switch circuit includes a reference capacitance element to be charged by the reference voltage and a diode element to be reverse-biased by a charged voltage of the reference capacitance element, wherein the turning on voltage is applied to the switch circuit, and the diode element is forward-biased to turn on, and then the switch circuit is turned on.

According to another aspect of the present embodiment, a power supply device is provided whereby among an inductive reactance and a capacitive reactance, a reactance value of the main reactance circuit is set to a value of either one of them, while the sub-reactance circuit is set to a value of the other one.

According to another aspect of the present embodiment, the power supply device is provided further including an auxiliary power source, whereby the reference capacitance element is charged by the auxiliary power source.

According to another aspect of the present embodiment, the power supply device is provided, whereby the reference capacitance element is charged by the DC power source.

Note that the above-discussed capacitance element also includes a capacitive circuit made of a plurality of capacitors.

Other Embodiments

According to one embodiment, a power supply device may include: a DC power source to output a DC power source voltage, a high frequency amplifying circuit to generate a high frequency output current by repeatedly turning on and turning off a semiconductor switch connected to the DC power source, a main reactance circuit having a predetermined reactance value, through which the output current flows, and an output terminal electrically connected to the main reactance circuit. This embodiment is a power supply device of which a high frequency output voltage is supplied to a load from the output terminal. The power supply device further includes a protection circuit connected in parallel to the main reactance circuit, the protection circuit includes a switch circuit which turns on when a turning on voltage larger than a predetermined reference voltage is applied, and a sub-reactance circuit having a predetermined reactance value, and once the switch circuit is turned on, a current flowing through the switch circuit flows into the sub-reactance circuit.

According to another embodiment, the power supply device may be provided, whereby once the switch circuit turned on, an impedance value between the high frequency amplifying circuit and the output terminal becomes larger than an impedance value when the protection circuit is in turned off.

According to another embodiment, the power supply device may be provided, whereby an impedance value of a parallel connection circuit of the protection circuit and the main reactance circuit when the switch circuit is turned on is set to be larger than an impedance value of the parallel connection circuit of the protection circuit and the main reactance circuit when the switch circuit is turned off.

According to another embodiment, the power supply device may be provided, whereby the reactance value of the main reactance circuit is set to either one of an inductive reactance value and a capacitive reactance value, while the reactance value of the sub-reactance circuit is set to the other one.

According to another embodiment, the power supply device may be provided, whereby the switch circuit includes: a reference capacitor to be charged to the reference voltage, and a diode element to be reverse-biased by a charged voltage of the reference capacitor. Once a voltage by which the diode element is forward-biased and is applied to the switch circuit, the diode element turns on, and the switch circuit turns on.

According to another embodiment, the power supply device may be provided, further including an auxiliary power source, wherein the reference capacitor is to be charged by the auxiliary power source.

According to another embodiment, the power supply device may be provided, whereby the reference capacitor is configured to be charged by the DC power source.

According to another embodiment, the power supply device may be provided, whereby the high frequency amplifying circuit includes an inductive output-inductance circuit whose one terminal is electrically connected to the DC power source while the other terminal is electrically connected to the semiconductor switch. The output current is generated by the current flowing through the output inductance circuit due to repeated turning on and turning off of the semiconductor switch.

According to yet another embodiment, the power supply device may be provided further including a transformer, whereby the output current generated by the high frequency amplifying circuit flows through a primary winding of the transformer, and the output voltage is induced in a secondary winding that is magnetically coupled to the primary winding.

<Basic Operation and Operation Waveform of High Frequency Current Limiting Circuit>

Hereinafter, a circuit having a later-discussed protection circuit and main reactance circuit connected in parallel to each other will be referred to as a "high frequency current limiting circuit." The basic operation and operation waveform of a power supply circuit will be described.

In one embodiment, the high frequency current limiting circuit is inserted in series between a high frequency amplifying circuit and a load. When the impedance of the load has fluctuated and the output current of the high frequency amplifying circuit is going to increase, it is possible to reduce the output current by an increase of the series impedance of the high frequency current limiting circuit.

The current-limiting function of the high frequency current limiting circuit will be described (FIGS. 13A, 13B).

<Case without High Frequency Current Limiting Circuit (Conventional Case)>

When the high frequency amplifying circuit is regarded as a high frequency voltage source "VRF", a current inversely proportional to the absolute value of a "Load" impedance is output (as in Formula below).

$$|Iout_{NoLimit}| = \frac{|VRF|}{|Z_{Load}|} \quad \text{[Formula 1]}$$

For example, when the absolute value of the load impedance seen from the high frequency amplifying circuit has been designed so as to be approximately 30 to 40Ω, if the absolute value of the load impedance drops down to 1Ω, a current 30 to 40 times larger than the designed one will flow.

<Case with High Frequency Current Limiting Circuit>

First, circuit constants of the high frequency current limiting circuit need to be adjusted to appropriate values in advance in order for the high frequency current limiting circuit to function properly. Hereinafter, a word "diode element" will be abbreviated as a "D". The absolute value of an impedance between an "A" electrode terminal and a "B" electrode terminal is set to be larger when D1, D2, D3, and D4 turn on than when D1, D2, D3, and D4 turn off. In a state where turning on is established between the anode and cathode of each of D1, D2, D3, and D4, the absolute value of a combined impedance of L (coil) and C (capacitor) becomes the highest under parallel resonance conditions. Here, the oscillation frequency is designated by f and the circular constant is designated by π. The reactance value of L or C is adjusted in accordance with the relationship of Formula below.

$$2\pi f = \frac{1}{\sqrt{LC}} \quad \text{[Formula 2]}$$

<Behavior in State not being Current-Limited>

A state not being current-limited refers to a state where the voltage applied to each of D1, D2, D3, and D4 is a reverse bias voltage or a state where a voltage not exceeding a threshold voltage Vf of a diode element is applied even if the diode element is forward-biased. In this state, the protection circuit has the impedance of a combined capacitance of the parasitic capacitances of D1, D2 and the capacitance of C. Because the absolute value of the combined impedance of D1, D2 and C is set to be larger than that of L, it may be assumed that most of the output current flows through L, while the rest of the output current flows into C (FIG. 14(a)).

<Behavior in State being Current-Limited>

A state being current-limited is mainly classifies into four states below (FIG. 15).

Period [A]: the period in which D2, D4 turn on;
Period [B]: the period in which D1, D2, D3, and D4 turn off;
Period [C]: the period in which D1, D3 turn on; and
Period [D]: the period in which D1, D2, D3, and D4 turn off.

In the period [B] and period [D], because the voltage applied to each of D1, D2, D3, and D4 does not exceed the threshold voltage, the output current mainly flows into L. Into the protection circuit, a current flows through the parasitic capacitances of the diode elements.

In the period [A] and the period [C], D1, D3 or D2, D4 turn on, so that the turning on diode elements and a reference voltage source Vlimit provide a short circuit impedance when high frequency direct current flows. Therefore, a current based on the impedance of C flows into the protection circuit. Because L and C give an impedance relationship serving as the parallel resonance condition of Formula 2, the current attempts to flow so as to cancel out the current of L. As the result, the effective value of a combined current of IL and IC (i.e., the current that flows through the coil, and the capacitor, respectively) becomes smaller so as to limit the current (FIG. 14(b)).

Also in a case where the main reactance circuit is capacitive and the sub-reactance circuit is inductive, a similar operation can be confirmed (FIG. 16).

<Behavior in State not being Current-Limited>

In the state not being current-limited, a reverse bias is applied to each of D1, D2, D3, and D4, or even a forward voltage applied to each of D1, D2, D3, and D4. The threshold voltage Vf of the diode element cannot be exceeded so that the protection circuit has the impedance of a combined capacitance of the parasitic capacitance of D1, D2 and the capacitance of C. Because the absolute value of the combined impedances of D1, D2 and the capacitance of C is set to be larger than that of L, it may be assumed that most of the output current flows into L while the rest flows through C (FIG. 17(a)).

<Behavior in State being Current-Limited>

In the state being current-limited (FIG. 17(b)), the period is classified into the periods A to D below (FIG. 18).

Period [A]: the period in which D2, D4 turn on;
Period [B]: the period in which D1, D2, D3, D4 turn off;
Period [C]: the period in which D1, D3 turn on; and
Period [D]: the period in which D1, D2, D3, D4 turn off.

In Period [B] and Period [D], the voltage applied to each of D1, D2, D3, D4 does not exceed the threshold voltage so that the output current mainly flows into C. In the protection circuit, a current flows through the parasitic capacitances of the diode elements.

In Period [A] and Period [C], D1, D3 or D2, D4 turn on, so that the turning on diode elements and the reference voltage source Vlimit provide a short circuit impedance when high frequency direct current flows, therefore a current based on the impedance of L flows into the protection circuit. Because L and C give an impedance relationship serving the parallel resonance condition of Formula 2, the current attempts to flow so as to cancel out the current flowing through C. As a result, the effective value of the combined current of IL and IC becomes smaller so as to limit the current.

Moreover, with respect to the rectifying circuit, a full-wave rectifying circuit or other rectifying circuits, such as half-wave voltage doubler rectifying circuits, may be employed if the impedance between the "A" electrode terminal and the "B" electrode terminal has been designed so as to increase when the diode elements turn on compared to the impedance when the diode elements turn off, regardless of the polarity of the current flowing into the rectifying circuit.

In the case of the half-wave voltage doubler rectifying circuit (FIG. 19), an AC coupling capacitor Cc is taken into consideration, and an adjustment may be performed in a manner such that a combined impedance of Cc, L, and C between the "A" electrode terminal and "B" electrode terminal becomes the maximum when D1 and D2 are in a short-circuit state (FIGS. 20, 21).

In order to isolate the DC voltage source Vlimit from an RF supplying circuit, a transformer-coupled rectifying circuit (FIG. 22) as described below is also applicable (FIGS. 23, 24). In the example described below, in a state where the anode and cathode of each of D1, D2 are short-circuited, a combined impedance of an impedance of the sub-reactance circuit of Cc, Tx, and L, and an impedance of C of the main reactance circuit is adjusted.

[Characteristics Required for High Frequency Current Limiting Circuit to Effectively Function]

The characteristics required for each circuit from the view point of the impedance of the high frequency current limiting circuit will be described.

The impedance of each circuit at the oscillation frequency of each circuit of FIG. 13(b) is defined as illustrated in FIG. 29, the contents of which are discussed below.

The impedance of the main reactance circuit: $Z1=R1+jX1$ [Ω]

The impedance of the sub-reactance circuit: $Z2=R2+jX2$ [Ω]

The impedance of the turning on switch circuit: $ZS_{ON}=RS_{ON}+jXS_{ON}$ [Ω]

The impedance of the turning off switch circuit: $ZS_{OFF}=RS_{OFF}+jXS_{OFF}$ [Ω]

The impedance of the protection circuit when the switch circuit is turned on: $ZP_{ON}$ [Ωi]

The impedance of the protection circuit impedance when the switch circuit is turned off: $ZP_{OFF}$ [Ωl]

The impedance of the high frequency current limiting circuit when the switch circuit is turned on: $ZLimit_{ON}$ [Ω]

The impedance of the high frequency current limiting circuit when the switch circuit is turned off: $ZLimit_{OFF}$ [Ω]

The load impedance: $ZLoad$ [Ω]

The high frequency current limiting circuit is a parallel connection circuit of the protection circuit and the main reactance circuit, and the absolute value of this combined impedance is given in Formula A1 and Formula A2 below.

[Formula 3]

$$|ZLimit_{ON}| = \sqrt{\frac{(R1^2 + X1^2) \times ((R2 + RS_{ON})^2 + (X2 + XS_{ON})^2)}{(R1 + R2 + RS_{ON})^2 + (X1 + X2 + XS_{ON})^2}} \, [\Omega] \quad \text{A1}$$

[Formula 4]

$$|ZLimit_{OFF}| = \sqrt{\frac{(R1^2 + X1^2) \times ((R2 + RS_{OFF})^2 + (X2 + XS_{OFF})^2)}{(R1 + R2 + RS_{OFF})^2 + (X1 + X2 + XS_{OFF})^2}} \, [\Omega] \quad \text{A2}$$

Because R1, R2, and $RS_{ON}$ each have a positive value, the conditions that the absolute value of the impedance of the high frequency current limiting circuit when the switch circuit is turned on becomes the maximum are:

$X1 \neq 0$ [Ω],
$X2 + XS_{ON} \neq 0$ [Ω], and
$X1 + X2 + XS_{ON} = 0$ [Ω]

In this specification, "≈" is used as a symbol indicating that the left side and right side are approximately equal. When adjustment has been made to be $X1 + X2 + XS_{ON} \approx 0$ [Ω], $ZLimit_{ON}$ is given by Formula A3 below.

[Formula 5]

$$ZLimit_{ON} \approx \frac{R1 \times (R2 + RS_{ON}) + X1^2}{R1 + R2 + RS_{ON}} + j\frac{(R2 + RS_{ON} - R1) + X1}{R1 + R2 + RS_{ON}} \, [\Omega] \quad \text{A3}$$

Here, in a case where a high frequency current limiting circuit is applied to a high frequency power source for plasma generation, in order to suppress the power loss, R1, R2, $RS_{ON}$, and $RS_{OFF}$ each have to be set to a very small value as compared with X1 of the main reactance circuit. Accordingly, in a case of $|X1| > 1$ [Ω], the term of the resistive component of the numerator of Formula A3 has a very small value as compared with the term of $X1^2$. Therefore, if the term of the resistance component is approximated as 0 [Ω], the resistive component is dominant in $ZLimit_{ON}$, as in Formula A4 below.

[Formula 6]

$$ZLimit_{ON} \approx \frac{X1^2}{R1 + R2 + RS_{ON}} \, [\Omega] \quad \text{A4}$$

Under the conditions satisfying Formula A4, series-connected $ZLimit_{ON}$, will appear in the impedance seen from the high frequency voltage source VRF regardless of the conditions of the load impedance, so that the current-limiting function can be stably achieved.

The current when the switch circuit of the high frequency current limiting circuit turn on will be described.

Here, assuming the following circuit conditions: $X1 + X2 + XS_{ON} = 0$ [Ω], and R1, R2, $RS_{ON}$ and $RS_{OFF}$ each have a very small resistance as compared with $|X1|$ and are approximated to 0 [Ω]. Then . . .

$$ZP_{ON} = R2 + RS_{ON} + j(X2 + XS_{ON}) \approx -jX1 \, [\Omega] \quad \text{A5}$$

$$Z1 = R1 + jX1 \approx jX1 \, [\Omega] \quad \text{A6}$$

$ZP_{ON}$ and Z1 are the impedances which are complex conjugates with each other. Therefore, because $ZP_{ON}$ and Z1 are connected in parallel with each other, the current flowing through the protection circuit is a current having the same magnitude as the current flowing through the main reactance circuit, but has an opposite phase thereto. Accordingly, in a state where the high frequency current limiting circuit exhibits the current-limiting function, the output current is limited because when the switch circuit is turned on, a current which cancels out the current flowing through the main reactance circuit flows through the protection circuit.

Next, the impedance conditions when the switch circuit is turned off will be described.

First, the difference between a reactance value of the switch circuit turning on and a reactance value of the switch circuit turning off is set to be larger than the reactance value of the main reactance circuit.

$$|XS_{ON} - XS_{OFF}| > |X1| \quad \text{B1}$$

Because the protection circuit has a switch circuit formed by combining a plurality of elements, the resistive component of the impedance of the protection circuit tends to be large compared to the main reactance circuit. Therefore, a power loss in the steady state needs to be suppressed. The output current generated by the high frequency amplifying circuit should be prevented from flowing into the protection circuit as much as possible by setting the absolute value of the impedance of the protection circuit turning off to be larger than the absolute value of an impedance of the main reactance circuit. Because the current to flow is determined by the absolute value of the impedance of each circuit, when the absolute value of the impedance $ZP_{off}$ of the protection circuit of which the switch circuit turn on is set so as to be G-times the absolute value of the impedance of the main reactance circuit (G>1), Relational Formula B2 below is obtained.

$$G \times |Z1| = |ZP_{OFF}| \, [\Omega] \quad \text{B2}$$

If the conditions: R1, R2, $RS_{ON}$, $RS_{OFF} << X1 < |XS_{ON} - XS_{OFF}|$ and $XS_{ON} \approx -(X1+X2)$ [Ω] are applied, and further Relational Formula B2 is applied to Formula A2, the Approximation Formula B3 below is obtained.

[Formula 7]

$$|ZLimit_{OFF}| \approx \frac{G \times X1^3}{|XS_{ON} - XS_{OFF}|} \, [\Omega] \quad \text{B3}$$

By Formulas A4 and B3, the condition that the absolute value of the impedance of the high frequency current limiting circuit when the switch circuit turn off becomes larger than the absolute value of an impedance of the high frequency current limiting circuit when the switch circuit turn on is given by Formula B4 below.

$$|XS_{ON} - XS_{OFF}| > G \times (R1 + R2 + RS_{ON}) \quad \text{B4}$$

Accordingly, the impedance conditions of each circuit required for the high frequency current limiting circuit to best function are given as follows:

$|X1| > 1$ [Ω]
$X1 + X2 + XS_{ON} \approx 0$ [Ω]
R1, R2, $RS_{ON}$, $RS_{OFF} << |X1|$ [Ω]
$|XS_{ON} - XS_{OFF}| > |X1|$
$G \times |Z1| = |ZP_{OFF}|$ [Ω] where G>1
$|XS_{ON} - XS_{OFF}| > G \times (R1 + R2 + RS_{ON})$

[Application to High Frequency Power Source]

An example when a class-E amplifying circuit is applied to the high frequency amplifying circuit is illustrated in FIGS. 25, 27, and 28. This is the amplifying circuit operating at the oscillation frequency of 13.56 MHz. In the high frequency current limiting circuit, C4=C2=2000 pF and L2 is finely adjusted to 137 nH as a rough standard of which the absolute value of the impedance between the "A" electrode terminal and the "B" electrode terminal becomes the maximum, i.e., the parallel resonance conditions are obtained when the anode and cathode of D1 or D2 turn on. In this example, |Z|=300Ω is the maximum value.

FIG. 11 shows changes in the impedance of the high frequency current limiting circuit when the inductance of the sub-reactance circuit is adjusted. Because the main reactance circuit and sub-reactance circuit each have a resistance component, the absolute value of the reactance has a resistive impedance of approximately 0Ω when the absolute value of the impedance as an adjustment mark is the maximum. When connected in series to the load, the resistance element of the impedance of the high frequency current limiting circuit is seen from the high frequency amplifying circuit as an impedance to which the resistance element is added, as it is without being affected by the reactance value of the load impedance. Therefore, the high frequency current limiting circuit can exhibit a stable current-limiting performance regardless of the load impedance.

Furthermore, FIG. 12 shows a difference in the impedance of the high frequency current limiting circuit between when the diode element of the high frequency current limiting circuit is turned on and when the diode element is turned off, in an application example. When the diode element is turned on, the reactance of the diode element can be regarded as 0Ω, and the absolute value of the impedance of the high frequency current limiting circuit is 300Ω. When the diode element is a semiconductor element, and a reverse bias voltage is applied to the diode element with the diode element turned off, the parasitic capacitance component of the diode element varies due to the magnitude of the reverse bias voltage. If the reactance values of the parasitic capacitance of the diode element at this time is in the range from −20 to −50Ω, the absolute value of the impedance of the high frequency current limiting circuit is around 10Ω. The difference in the impedance of the high frequency current limiting circuit between when the diode element of the high frequency current limiting circuit is turned on and when the diode element is turned off is approximately 30 times. Thus, the high frequency current limiting circuit has the performance to be able to operate as the circuit for impedance switching.

Because each circuit constant has a correlation with the limiting current with respect to the reference voltage, an appropriate value for each circuit constant is obtained by simulation or obtained experimentally. The impedance of the high frequency output circuit is optimized by a harmonic filter or under the normal load condition and the impedance of the high frequency amplifying circuit is adjusted to be 7+j20Ω (|Z|=21Ω) when the load impedance is 50Ω.

An example is shown in which the load impedance is shorted from 50Ω to cause the impedance of the load seen from an output section of the high frequency amplifying circuit to transition to a lower impedance state (|Z|<5Ω). A case of the protection circuit having high frequency current limiting circuit and a case of the protection circuit without high frequency current limiting circuit have been compared. In the case without the high frequency current limiting circuit, the output current increases 3.5 times within 3 microseconds after short circuit, while in the case having the high frequency current limiting circuit, a high-speed suppression operation is observed, and an increase in the output current is suppressed down to 1.5 times or less (FIG. 26).

Advantageous Effects

According to one embodiment, a high frequency output current generated by a high frequency amplifying circuit can be promptly limited, an improvement in reliability of a power supply device can be achieved, and the rating of a semiconductor switch can be lowered, so that a reduction in cost can be achieved.

Furthermore, the degree of freedom of layout will increase, the difficulty level of design will decrease, and the power efficiency also will be improved.

Moreover, the design of current protection of a high frequency power supply system including a power supply device will be simplified.

Moreover, the high frequency output current at a place where a current limiting element is installed can be limited in accordance with a set DC voltage regardless of load impedance.

BRIEF DESCRIPTION OF THE DRAWINGS

FIG. 13(a) is a simplified circuit diagram.
FIG. 13(b) is a simplified circuit diagram.

FIG. 20(*b*) illustrates how currents flow.

FIG. 23(*b*) illustrates how currents flow in the transformer-coupled rectifying circuit.

DETAILED DESCRIPTION OF EMBODIMENTS

Hereinafter, the description of a parasitic capacitance connected in parallel to a semiconductor element, such as a diode element, will be omitted in the attached drawings.

Figure 1:
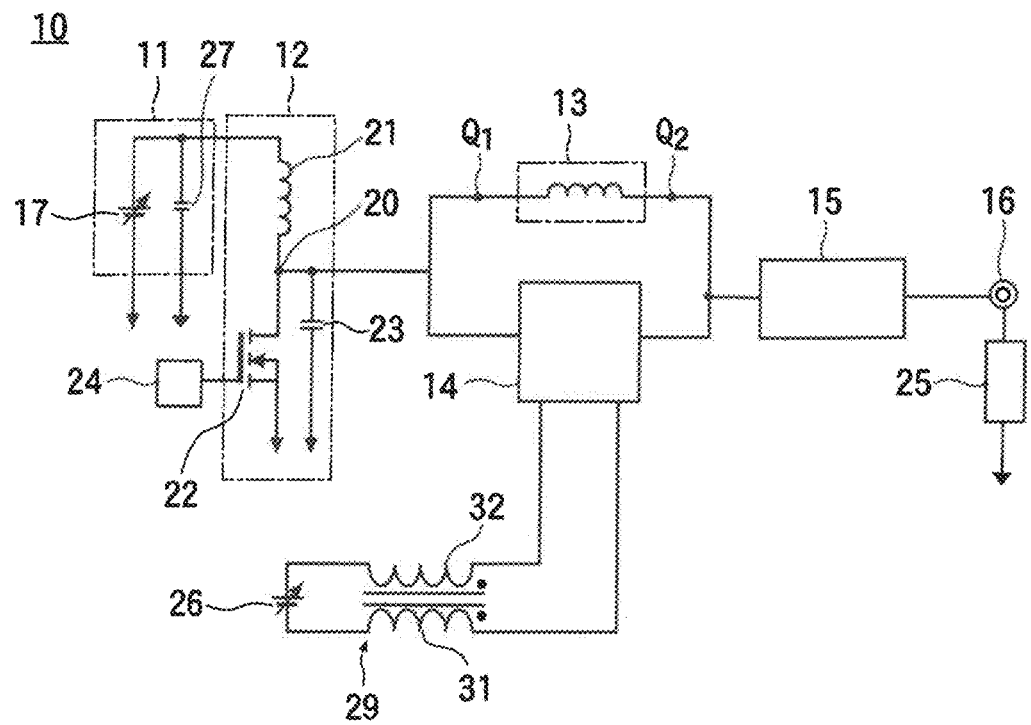
FIG. 1 is a first exemplary circuit.
Figure 2:
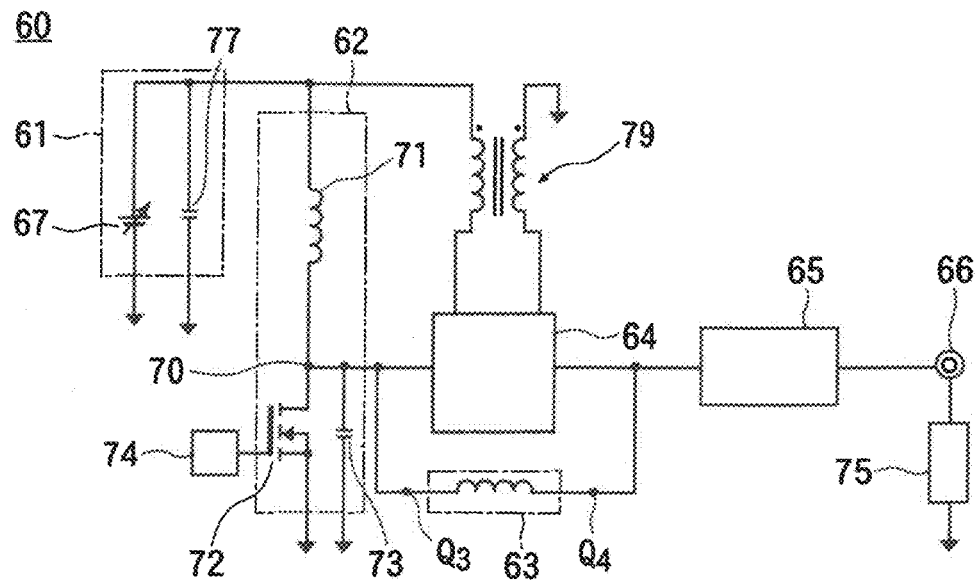
FIG. 2 is a second exemplary circuit.

Reference numeral 10 of FIG. 1 represents a first exemplary power supply device which supplies a high frequency power to a load 25, while reference numeral 60 of FIG. 2 represents a second exemplary power supply device which supplies a high frequency power to a load 75.

The power supply device 10 (60) includes: a DC power source 11 (61) which outputs a DC power source voltage; a high frequency amplifying circuit 12 (62) which switches a power source voltage to generate a high frequency output current; a main reactance circuit 13 (63) having a predetermined reactance value, and a filter circuit 15 (65) for removing high frequency waves. In the description of the embodiments, the "filter circuit" may be referred to also as a "high frequency output circuit."

The high frequency amplifying circuit 12 (62) of the first (second) exemplary power supply device 10 (60) respectively includes an output inductance circuit 21 (71) having a predetermined inductive reactance value, a semiconductor switch 22 (72) to turn on or turn off, an output capacitance element 23 (73) charged by a part of the current flowing through the output inductance circuit 21 (71), and a control circuit 24 (74) so as to control the turning on and turning off of the semiconductor switch 22 (72). A transistor element can be used for the semiconductor switch 22 (72).

One end of the output inductance circuit 21 (71) of the first (second) exemplary power supply device 10 (60) is electrically connected to the DC power source 11 (61), while the other end of the output inductance circuit 21 (71) is electrically connected to a semiconductor output terminal 20 (70) of the semiconductor switch 22 (72).

The DC power source 11 (61) includes a DC voltage outputting device 17 (67) and a power-source capacitance element 27 (77) for outputting a constant voltage. The DC voltage outputting device 17 (67) and the power-source capacitance element 27 (77) are connected in parallel with each other. One end of the DC voltage outputting device 17 (67) and one end of the power-source capacitance elements 27 (77) are electrically connected to one end of the output inductance circuit 21 (71), respectively, while the other end of the DC voltage outputting device 17 (67) and the other end of the power-source capacitance element 27 (77) are electrically connected respectively to the earth potential.

Once the semiconductor switch 22 (72) is turned on under the control of the control circuit 24 (74), a current flows into the output inductance circuit 21 (71) of the first (second) exemplary power supply device 10 (60). The current flowing into the output inductance circuit 21 (71) will flow to the earth potential through the semiconductor switch 22 (72) of the first (second) exemplary power supply device 10 (60).

The output capacitance element 23 (73) is connected in parallel with the semiconductor switch 22 (72). The charged output capacitance element 23 (73) is discharged via the semiconductor switch 22 (72) and the voltage at the semiconductor output terminal 20 (70) of the first (second) exemplary power supply device 10 (60) drops.

Once the semiconductor switch 22 (72) transitions from a turning on state to a turning off state under the control of the control-circuit 24 (74), an induced electromotive force having the polarity for maintaining the current flowing through the output inductance circuit 21 (71) is generated in the output inductance circuit 21 (71) to charge the output capacitance element 23 (73), thereby raising the voltage of the semiconductor output terminal 20 (70) of the first (second) exemplary power supply device 10 (60).

One end of the main reactance circuit 13 (63) of the first (second) exemplary power supply device 10 (60) is electrically connected to the semiconductor output terminal 20 (70), while the other end is electrically connected to the output terminal 16 (66) via the filter circuit 15 (65).

Due to the operation of the high frequency amplifying circuit 12 (62), a high frequency voltage swinging within a positive voltage range is generated at the semiconductor output terminal 20 (70), and a high frequency current output by the high frequency amplifying circuit 12 (62) is supplied to the main reactance circuit 13 (63) from the semiconductor output terminal 20 (70) and flows through the main reactance circuit 13 (63), so that a high frequency output voltage is applied to the output terminal 16 (66).

The load 25 (75) is electrically connected to the output terminal 16 (66). The output voltage is supplied to the load 25 (75) from the output terminal 16 (66). In the first (second) exemplary power supply device 10 (60), the output current flows through the filter circuit 15 (65) and is supplied to the load 25 (75) from the output terminal 16 (66).

The first (second) exemplary power supply device 10 (60) is a high frequency power supply device for a vacuum processing apparatus used for generation and maintenance of plasma. The load 25 (75) represents the impedance of the plasma.

In an unsteady state, such as when plasma is going to be generated, when plasma becomes unstable, or when plasma disappears, the impedance of the plasma varies, and therefore the value of the impedance of the load 25 (75) at the unsteady state will vary.

The first (second) exemplary power supply device 10 (60) includes a protection circuit 14 (64) connected in parallel to the main reactance circuit 13 (63).

Reference numerals $Q_1$, $Q_2$ ($Q_3$, $Q_4$) in FIG. 1 to FIG. 10 represent the electrodes of the main reactance circuit 13 (63). One electrode $Q_1$ ($Q_3$) is connected to the high frequency amplifying circuit 12 (62), while another electrode $Q_2$ ($Q_4$) is connected to the filter circuit 15 (65), which is the high frequency output circuit.

Figure 3:
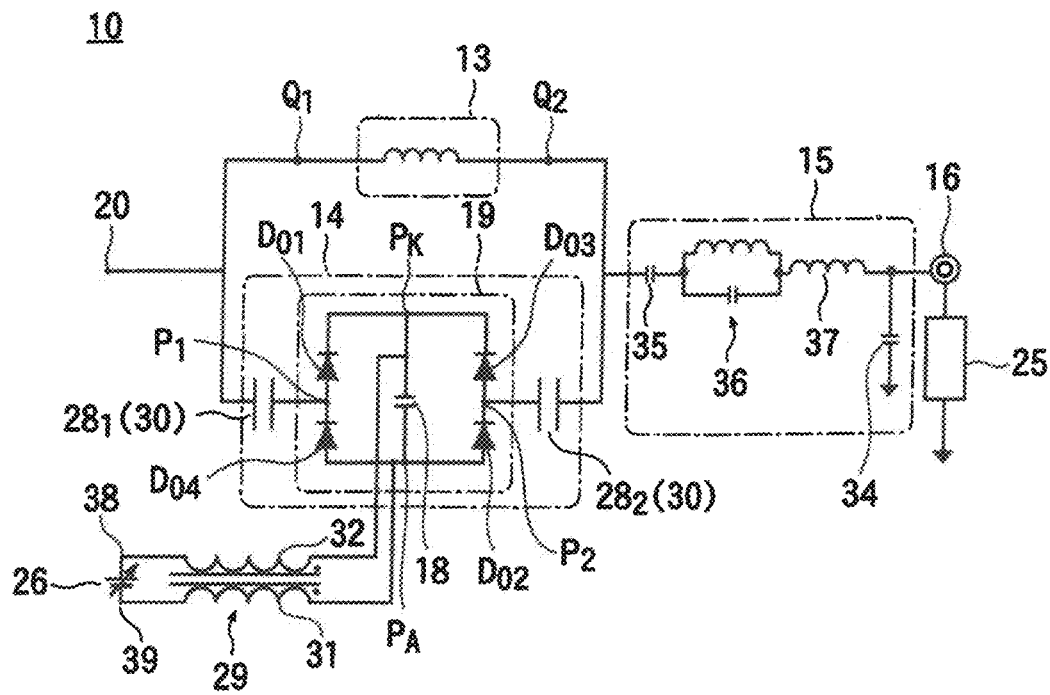
FIG. 3 is a detailed circuit diagram (1) of the first exemplary circuit of the present embodiment.
Figure 4:
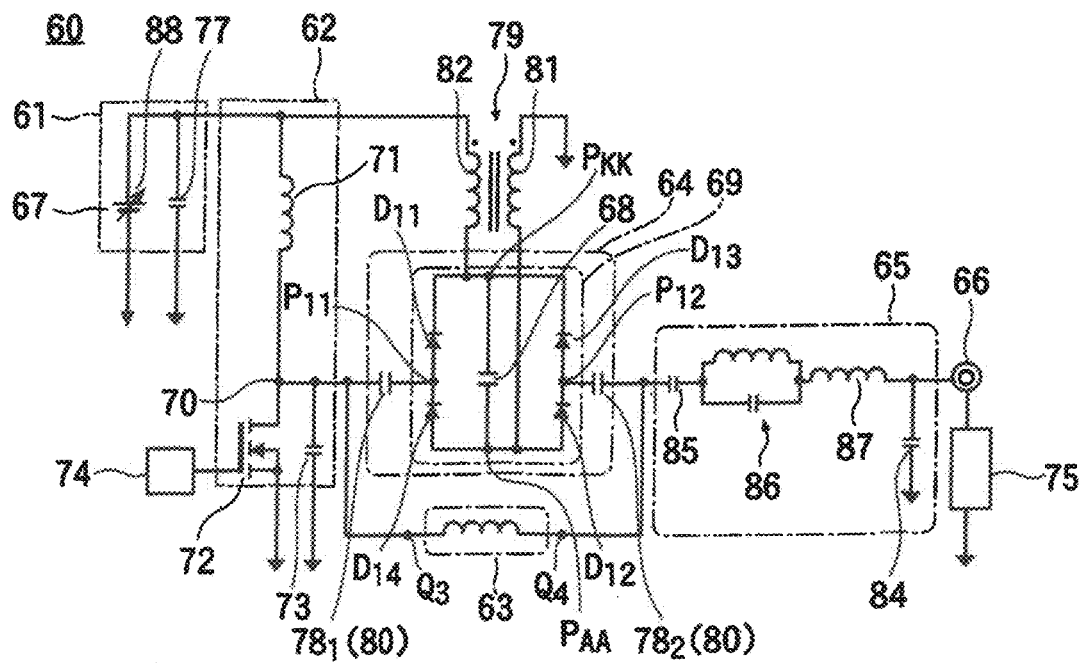
FIG. 4 is a detailed circuit diagram (1) of the second exemplary circuit of the present embodiment.
Figure 5:
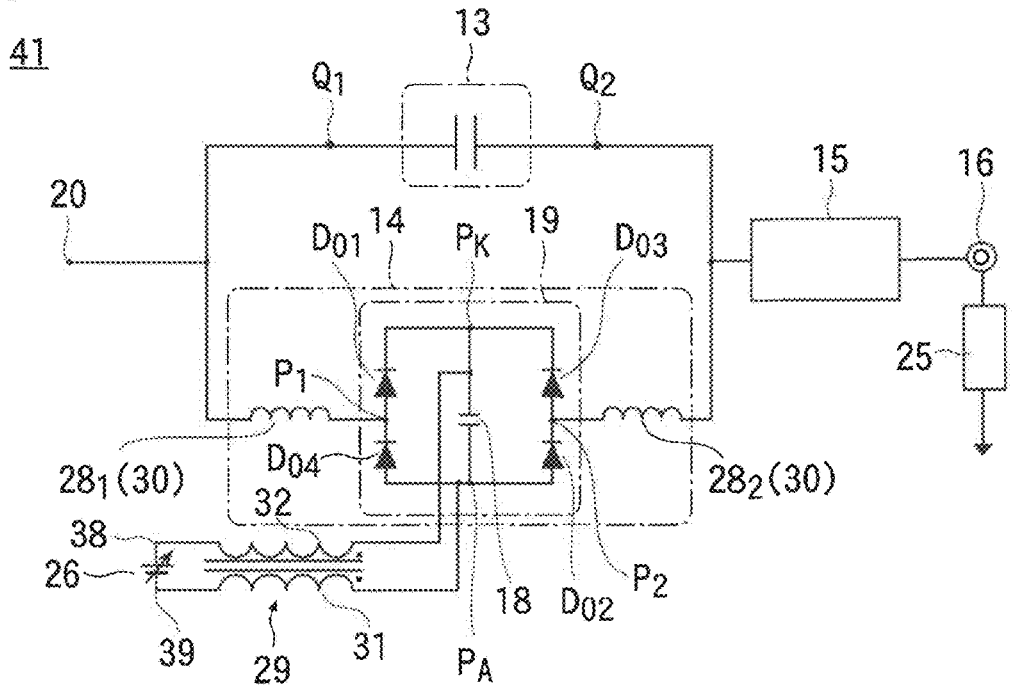
FIG. 5 is a detailed circuit diagram (2) of the first exemplary circuit of the present embodiment.
Figure 6:
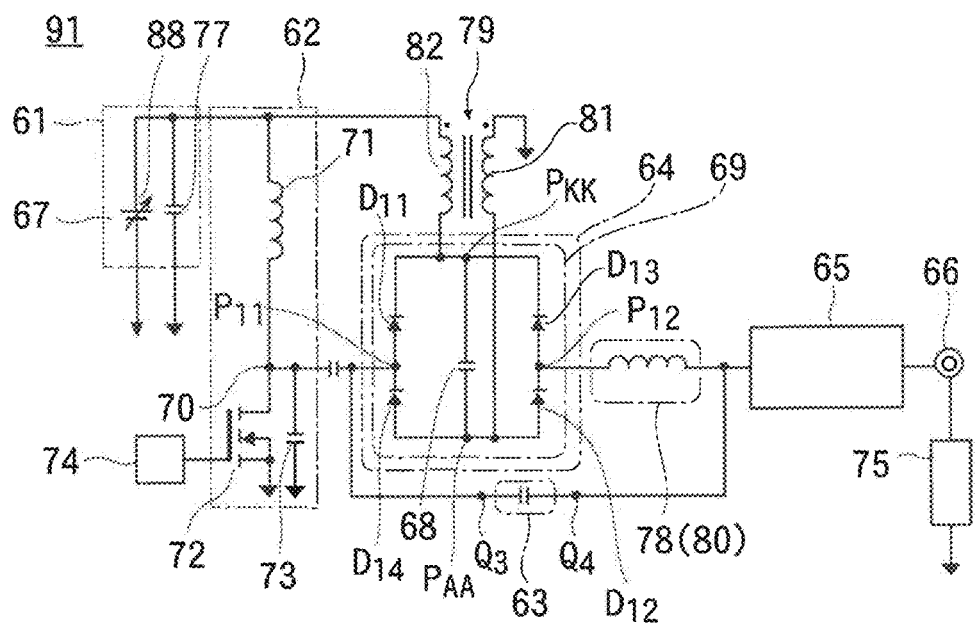
FIG. 6 is a detailed circuit diagram (2) of the second exemplary circuit of the present embodiment.

FIG. 3 shows an example of the internal circuit of the protection circuit 14 of the first exemplary power supply device 10, while FIG. 4 shows an example of the internal circuit of the protection circuit 64 of the second exemplary power supply device 60.

The protection circuit 14 (64) includes a switch circuit 19 (69) and a sub-reactance circuit 30 (80) having a predetermined reactance value.

The sub-reactance circuit 30 (80) of the first (second) power supply device 10 (60) includes a first sub-reactance element $28_1$ ($78_1$) and a second sub-reactance element $28_2$ ($78_2$). The first sub-reactance element $28_1$ ($78_1$), the switch circuit 19 (69), and the second sub-reactance element $28_2$ ($78_2$) are connected in series. Accordingly, even if the switch circuit 19 (69) is arranged between the first sub-reactance element $28_1$ ($78_1$) and the second sub-reactance element $28_2$ ($78_2$), the switch circuit 19 (69) and the sub-reactance circuit 30 (80) are connected in series. This series-connected circuit constitutes the protection circuit 14 (64), and the protection circuit 14 (64) is connected in parallel to the main reactance circuit 13 (63).

The switch circuit 19 (69) turns on when a turning on voltage higher than a predetermined reference voltage is applied thereto, while when a voltage below the predetermined reference voltage is applied, the switch circuit 19 (69) turns off.

Hereinafter, a state where the switch circuit 19 (69) turns on is referred to as a turning on state, while a state where the switch circuit 19 (69) turns off is referred to as a turning off state. Even when the switch circuit 19 (69) is in a turning off state, a current is caused to flow into the switch circuit 19 (69) due to a parasitic capacitance later discussed. Therefore, the output current generated by the high frequency amplifying circuit 12 (62) will flow into both the main reactance element 13 (63) and the protection circuit 14 (64), both when the switch circuit 19 (69) is in a turning on state and when the switch circuit 19 (69) is in a turning off state.

The absolute value of the impedance of the protection circuit 14 (64) when the switch circuit 19 (69) is in a turning off state is set so as to be larger than the absolute value of the impedance of the main reactance circuit 13 (63), while the absolute value of the impedance of the protection circuit 14 (64) when the switch circuit 19 (69) is in a turning on state is set so as to be smaller than the absolute value of the impedance of the main reactance circuit 13 (63). Accordingly, when the switch circuit 19 (69) is in a turning off state, the current flowing through the protection circuit 14 (64) becomes smaller than the current flowing through the main reactance circuit 13 (63), while when the switch circuit 19 (69) is in a turning on state, the current flowing through the protection circuit 14 (64) becomes larger than the current flowing through the main reactance circuit 13 (63).

The reactance value of the main reactance circuit 13 (63) is set so as to exceed 1Ω, while the resistance value of the main reactance circuit 13 (63) is set a value smaller than the reactance value thereof.

Moreover, a difference between a reactance value of the protection circuit 14 (64) when the switch circuit 19 (69) is in a turning on state and a reactance value of the protection circuit 14 (64) when the switch circuit 19 (69) is in a turning off state is set so as to be larger than the reactance value of the main reactance circuit 13 (63), and the resistance value of the switch circuit 19 (69) is set to a value smaller than the reactance value of the main reactance circuit 13 (63).

The value of the reactance of the sub-reactance circuit 30 (80) is set a value in a manner such that the absolute value of the impedance of a parallel circuit of the protection circuit 14 (64) and the main reactance circuit 13 (63) in a turning on state larger than the absolute value of an impedance of a parallel circuit of the protection circuit 14 (64) and the main reactance circuit 13 (63) in a non-conduction state. Therefore, once the protection circuit 14 (64) transitions from a turning off state to a turning on state, the output current will hardly flow.

Moreover, the value of the resistance of the sub-reactance circuit 30 (80) is set to a small value in comparison to the reactance value of the main reactance circuit.

The content of the switch circuit 19 (69) will be discussed.

The switch circuit 19 (69) of the first (second) power supply device 10 (60) includes a plurality of diode elements and a reference capacitance element 18 (68) to be charged to a predetermined reference voltage.

Here, the switch circuit 19 (69) includes first to fourth diode elements $D_{00}$ to $D_{04}$ ($D_{11}$ to $D_{14}$). The cathode terminal of the fourth diode element $D_{04}$ ($D_{14}$) is electrically connected to the anode terminal of the first diode element $D_{00}$ ($D_{11}$), and the cathode terminal of the second diode element $D_{02}$ ($D_{12}$) is electrically connected to the anode terminal of the third diode element $D_{03}$ ($D_{13}$).

The cathode terminal of the first diode element $D_{01}$ ($D_{11}$) and the cathode terminal of the third diode element $D_{03}$ ($D_{13}$) are electrically connected, and the anode terminal of the fourth diode element $D_{04}$ ($D_{14}$) and the anode terminal of the second diode element $D_{02}$ ($D_{12}$) are electrically connected.

The first to fourth diode elements $D_{01}$, $D_{02}$, $D_{03}$ and $D_{04}$ ($D_1$, $D_{12}$, $D_{13}$ and $D_{14}$) have parasitic capacitances $D_{01}$, $D_{02}$, $D_{03}$ and $D_{04}$ ($D_{11}$, $D_{12}$, $D_{13}$ and $D_{14}$) of the diode elements as a parallel element, respectively.

The first to fourth diode elements $D_{01}$, $D_{02}$, $D_{03}$ and $D_{04}$ ($D_{11}$, $D_{12}$, $D_{13}$ and $D_{14}$) applied with a forward voltage turn on, and a current flows through the protection circuit 14 (64). When a reverse voltage is applied to the diode elements $D_{01}$, $D_{02}$, $D_{03}$ and $D_{04}$ ($D_{11}$, $D_{12}$, $D_{13}$ and $D_{14}$), respectively, a current will not flow through a junction section of the diode element itself and the diode elements $D_{01}$ to $D_{04}$ ($D_{11}$ to $D_{14}$) are shut off but a current will flow through the parasitic capacitances $D_{01}$, $D_{02}$, $D_{03}$ and $D_{004}$ ($D_1$, $D_{12}$, $D_{13}$ and $D_{14}$) of the diode elements.

The main reactance circuit 13 (63) has two terminals. Hereinafter, the connection portion between the anode terminal of the first diode element $D_{01}$ ($D_{11}$) and the cathode terminal of the fourth diode element $D_{04}$ ($D_{14}$) will be referred to as a first connection point $P_1$ ($P_{11}$), and the connection portion between the anode terminal of the third diode element $D_{03}$ ($D_{13}$) and the cathode terminal of the second diode element $D_{02}$ ($D_{12}$) will be referred to as a second connection point $P_2$ ($P_{12}$). One end of the first sub-reactance element $28_1$ ($78_1$) is electrically connected to the first connection point $P_1$($P_{11}$), while the other end is electrically connected to one end of the main reactance circuit 13 (63).

One end of the second sub-reactance element $28_2$ ($78_2$) is electrically connected to the second connection point $P_2$ ($P_{12}$), while the other end is electrically connected to the other end of the main reactance circuit 13 (63) and one end of the filter circuit 15 (65). The other end of the filter circuit 15 (65) is electrically connected to the output terminal 16 (66).

Hereinafter, the portion where the cathode terminal of the first diode element $D_{01}$ ($D_{11}$) and the cathode terminal of the third diode element $D_{03}$ ($D_{13}$) are electrically connected will be referred to as a cathode point $P_K$ ($P_{KK}$), and the portion where the anode terminal of the fourth diode element $D_{04}$ ($D_{14}$) and the anode terminal of the second diode element $D_{02}$ ($D_{12}$) are electrically connected will be referred to as an anode point $P_A$ ($P_{AA}$). One end of the reference capacitance element 18 (68) is electrically connected to the cathode point $P_K$ ($P_{KK}$), while the other end is electrically connected to the anode point $P_A$ ($P_{AA}$). The first to fourth diode elements $D_{01}$ to $D_{04}$ ($D_{11}$ to $D_{14}$) and the reference capacitance element 18 (68) constitute an H-bridge circuit.

In this embodiment including the power supply devices discussed later, a filter circuit can be used. Here, an identical filter circuit 15 (65) is assumed to be used.

This filter circuit 15 (65) includes: a blocking capacitance element 35 (85), a first filter circuit 36 (86) formed by connecting an inductance element and a capacitance element in parallel, a second filter circuit 37 (87) made of an inductance element, and a third filter circuit 34 (84) made of a capacitance element. The blocking capacitance element 35 (85), the first filter circuit 36 (86), and the second filter circuit 37 (87) are connected in series so as to electrically connect the output terminal 16 (66) to the portion where the main reactance circuit 13 (63) and the protection circuit 14 (64) are connected. The third filter circuit 34 (84) connects the output terminal 16 (66) to the earth potential, so that the output current having frequency easily passes between the high frequency amplifying circuit 12 (62) and the output terminal 16 (66).

Next, as shown in FIG. 3, the items specific to the first exemplary power supply device 10 will be discussed.

The first exemplary power supply device 10 includes an auxiliary power source 26.

The auxiliary power source 26 includes a positive voltage terminal 38 for outputting a DC positive voltage and a negative voltage terminal 39 for outputting a voltage negative to the voltage of the positive voltage terminal 38. The positive voltage terminal 38 is electrically connected to the cathode point $P_K$, while the negative voltage terminal 39 is electrically connected to the anode point $P_A$. The positive voltage which the auxiliary power source 26 outputs from the positive voltage terminal 38 is applied to the cathode point $P_K$, while the negative voltage output from the negative voltage terminal 39 is applied to the anode point $P_A$. The reference capacitance element 18 is charged by the voltage output by the auxiliary power source 26.

When a voltage of which the reference capacitance element 18 has been charged is called as the reference voltage, a voltage of the auxiliary power source 26, which is the voltage of the positive voltage terminal 38 to the negative voltage terminal 39, is the reference voltage. The reference voltage appearing between the both ends of the reference capacitance element 18 is applied as a reverse bias to a series circuit of the first and fourth diode elements $D_{01}$, $D_{04}$ and a series circuit of the second and third diode elements $D_{02}$, $D_{03}$ in the bridge circuit. Thus, electric continuity of the first to fourth diode elements $D_{01}$ to $D_{04}$ is prevented.

Note that, here a common-mode choke coil 29 is inserted between the auxiliary power source 26 and the reference capacitance element 18. Among two magnetically coupled windings 31, 32 in the common-mode choke coil 29, one end of the winding 31 is electrically connected to the anode point $P_A$, while the other end is electrically connected to the negative voltage terminal 39. One end of the winding 32 is electrically connected to the cathode point $P_K$, while the other end is electrically connected to the positive voltage terminal 38.

The two windings 31, 32 are designed so as to have the same polarity. When a current heading toward the auxiliary power source 26 flows through both the two windings 31, 32 or when a current heading toward the protection circuit 14 flows through the both two windings 31, 32, the two windings 31, 32 function as an inductance element to make the current difficult to flow. When a voltage having the same polarity and the same magnitude output by the high frequency amplifying circuit 12 is applied to the anode point $P_A$ and the cathode point $P_K$, then this voltage is attenuated or shut off by the common-mode choke coil 29 so as to be hardly applied between the positive voltage terminal 38 and negative voltage terminal 39 of the auxiliary power source 26.

Next, as shown in FIG. 4, the second exemplary power supply device 60 will be described.

The second exemplary power supply device 60 also includes a common-mode choke coil 79. Among two windings 81, 82 magnetically coupled within the common-mode choke coil 79, one end of the winding 81 is electrically connected to the anode point $P_{AA}$, while the other end is electrically connected to the earth potential.

One end of the winding 82 is electrically connected to the cathode point $P_{KK}$, while the other end is electrically connected to a portion where a DC power source 61 and the output inductance circuit 71 are connected.

Because the anode point $P_{AA}$ of the reference capacitance element 68 is DC-connected to the earth potential and the cathode point $P_{KK}$ is DC-connected to the DC power source 61, the reference capacitance element 68 is charged by the DC voltage output by the DC power source 61.

Assuming that a voltage having the same polarity and the same magnitude output by the high frequency amplifying circuit 62 is applied to the anode point $P_A$ and cathode point $P_{KK}$, this voltage is attenuated or shut off by the common-mode choke coil 79 so as to be hardly applied to the DC power source 61.

As discussed above, if the charged voltage of the reference capacitance element 68 is referred to as the reference voltage, the reference capacitance element 18 (68) of the first (second) exemplary power supply device 10 (60) is charged by the reference voltage. When a voltage larger than the reference voltage and large enough to turn on the first diode element $D_{01}$ ($D_{11}$) and second diode element $D_{02}$ ($D_{12}$) is applied between the first connection point $P_1$ ($P_{11}$) and the second connection point $P_2$ ($P_{12}$), or when a voltage large enough to turn on the third diode element $D_{03}$ ($D_{13}$) and fourth diode element $D_{04}$ ($D_{14}$) is applied between the first connection point $P_1$ ($P_{11}$) and the second connection point $P_2$ ($P_{12}$), current will flow through the first diode element $D_{01}$ ($D_{11}$), the reference capacitance element 18 (68), and the second diode element $D_{02}$ ($D_{12}$), or a current will flow the inside of the switch circuit 19 (69) through the third diode element $D_3$ ($D_{13}$), the reference capacitance element 18 (68), and the fourth diode element $D_{04}$ ($D_{14}$).

That is, the switch circuit 19 (69) turns on when a voltage having a magnitude obtained by adding the reference voltage to two times the turning on voltage of the diode element is applied between the first connection point $P_1$ ($P_{11}$) and the second connection point $P_2$ ($P_{12}$).

Note that the voltage output by the auxiliary power source 26 is set to an appropriate value in a manner such that the switch circuit will not turn on when plasma is in a steady state.

When the switch circuit 19 (69) is in a turning off state, the absolute value of the impedance of the protection circuit 14 (64) is set to be larger than the absolute value of the impedance of the main reactance circuit 13 (63). Therefore, in a high frequency output current heading toward the load 25 (75) from the high frequency amplifying circuit 12 (62), the amount of a current flowing through the main reactance circuit 13 (63) is larger than the amount of a current flowing through the sub-reactance circuit 30 (80).

Hereinafter, a current which flows through the protection circuit 14 (64) when the switch circuit 19 (69) is in a turning off state may be referred to as a turning off current, while a current which flows through the protection circuit 14 (64) when the switch circuit 19 (69) is in a turning on state may be referred to as a turning on current. The cases where a turning off current flows into the protection circuit 14 (64) include a case where the voltage at the first connection point $P_1$ ($P_{11}$) is positive relative to the voltage at the second connection point $P_2$ ($P_{12}$), and a case where the voltage at the second connection point $P_2$ ($P_{12}$) is positive relative to the voltage at the first connection point $P_1$ ($P_{11}$).

When the voltage at the first connection point $P_1$ ($P_{11}$) is positive relative to the voltage at the second connection point $P_2$ ($P_{12}$), the current which flows into the switch circuit 19 (69) corresponding to the turning off current will flow from the first connection point $P_1$ ($P_{11}$) into the switch circuit 19 (69), flow through the parasitic capacitance $CD_{01}$ ($CD_{11}$) of the first diode element $D_{01}$ ($D_1$), the parasitic capacitance $CD_{04}$ ($CD_{14}$) of the fourth diode element $D_{04}$ ($D_{14}$), the reference capacitance element 18 (68), the parasitic capacitance $CD_{03}$ ($CD_{13}$) of the third diode element $D_{03}$ ($D_{13}$), and the parasitic capacitance $CD_{02}$ ($CD_{12}$) of the second diode element $D_{02}$ ($D_{12}$), and flow from the second connection point $P_2$ ($P_{12}$) to the outside of the switch circuit 19 (69).

On the contrary, when the voltage at the second connection point $P_2$ ($P_{12}$) is positive relative to the voltage at the first connection point $P_1$, the current which flows into the switch circuit 19 (69) corresponding to the turning off current will flow from the second connection point $P_2$ ($P_{12}$) into the switch circuit 19 (69), flow through the parasitic capacitance $CD_{03}$ ($CD_{13}$) of the third diode element $D_{03}$ ($D_{13}$), the parasitic capacitance $CD_{02}$ ($CD_{12}$) of the second diode element $D_{02}$ ($D_{12}$), the reference capacitance element 18 (68), the parasitic capacitance $CD_{01}$ ($CD_{11}$) of the first diode element $D_{00}$ ($D_{11}$), and the parasitic capacitance $CD_{04}$ ($CD_{14}$) of the fourth diode element $D_{04}$ ($D_{14}$), and flow from the first connection point $P_1$ ($P_{11}$) to the outside.

That is, the impedance of the protection circuit 14 (64), when the switch circuit 19 (69) is in a turning off state, is a combined impedance of a circuit formed of the sub-reactance circuit 30 (80), the parasitic capacitance $CD_{01}$ ($CD_{11}$) of the first diode element $D_{01}$ ($D_{11}$), the parasitic capacitance $CD_{04}$ ($CD_{14}$) of the fourth diode element $D_{04}$ ($D_{14}$), the reference capacitance element 18 (68), the parasitic capacitance $CD_{03}$ ($CD_{13}$) of the third diode element $D_{03}$ ($D_{13}$), and the parasitic capacitance $CD_{02}$ ($CD_{12}$) of the second diode element $D_{02}$ ($D_{12}$).

Note that, the absolute value of the impedance of the protection circuit 14 (64) when the switch circuit 19 (69) is in a turning off state is set so as to be larger than the absolute value of an impedance of the main reactance circuit 13 (63). The protection circuit 14 (64) and the main reactance circuit 13 (63) are connected in parallel, and thus, the current flowing through the main reactance circuit 13 (63) becomes larger than the current flowing through the protection circuit 14 (64).

When the switch circuit 19 (69) is in a turning off state, if a voltage which is larger than the reference voltage by two times the forward voltage of the diode element is applied between the first connection point $P_1$ ($P_{11}$) and the second connection point $P_2$ ($P_{12}$), then this voltage serves as a turning on voltage to turn on the switch circuit 19 (69) and a turning on current flows.

Here, when the turning on voltage at the first connection point $P_1$ ($P_{11}$) is positive relative to the voltage at the second connection point $P_2$ ($P_{12}$), the current which flows out from the first connection point $P_1$ ($P_{11}$) will flow into the second connection point $P_2$ ($P_{12}$) through the first diode element $D_{01}$ ($D_{11}$), the reference capacitance element 18 (68), and the second diode element $D_{02}$ ($D_{12}$).

On the contrary, when the turning on voltage at the first connection point $P_2$ ($P_{12}$) is positive relative to the voltage at the second connection point $P_1$ ($P_{11}$), the current which flows out from the second connection point $P_2$ ($P_{12}$) will flow into the first connection point $P_1$ ($P_{11}$) through the third diode element $D_{03}$ ($D_{13}$), the reference capacitance element 18 (68), and the fourth diode element $D_{04}$ ($D_{14}$).

That is, the impedance of the protection circuit 14 (64) when the switch circuit 19 (69) is in a turning on state is a combined impedance of a circuit formed of the sub-reactance circuit 30 (80), the first diode element $D_{01}$ ($D_{11}$), the reference capacitance element 18 (68), and the second diode element $D_{02}$ ($D_{12}$), or a combined impedance of a circuit formed of the sub-reactance circuit 30 (80), the third diode element $D_{03}$ ($D_{13}$), the reference capacitance element 18 (68), and the fourth diode element $D_{04}$ ($D_{14}$).

Accordingly, between the high frequency amplifying circuit 12 (62) and the load 25 (75), a current will flow in accordance with the impedance value of a circuit formed by parallel connecting the protection circuit 14 (64) and the main reactance circuit 13 (63). Therefore, when the switch circuit 19 (69) is in a turning on state, the high frequency amplifying circuit 12 (62) and the load 25 (75) will be connected to each other via an impedance value different from the impedance value in a turning off state.

In the first (second) exemplary power supply circuit 10 (60), the reactance value of the sub-reactance circuit 30 (80) is set in a manner such that the absolute value of the impedance of a circuit formed by parallel connecting the protection circuit 14 (64) and the main reactance circuit 13 (63) becomes larger than the absolute value of an impedance of the main reactance circuit 13 (63) in a turning off state. The high frequency amplifying circuit 12 (62) is electrically connected to the load 25 (75) via the absolute value of an impedance which is larger when the switch circuit 19 (69) is in a non-conduction state than when it is in a conduction state. Accordingly, at this time the current output by the high frequency amplifying circuit 12 (62) or the current flowing into the high frequency amplifying circuit 12 (62) is limited, and the semiconductor switch 22 (72) is protected.

Note that, if a reactance value of the main reactance circuit 13 (63), a reactance value of the sub-reactance circuit 30 (80), and a reactance value of the switch circuit 19 (69) in a turning on state are set in a manner such that a total sum thereof becomes close to zero, then when the switch circuit 19 (69) is in a turning on state, the absolute value of an impedance of a parallel circuit of the protection circuit 14 (64) and the main reactance circuit 13 (63) can be set to be larger than that when the total sum is not close to zero.

In the power supply device 10 (60) shown in FIG. 3 (FIG. 4), an inductance element is used for the main reactance circuit 13 (63) so as to be an inductive reactance, while a capacitance element is used for the sub-reactance circuit 30 (80) so as to be a capacitive reactance. However, as in a power supply device 41 (91) of FIG. 5 (FIG. 6), a capacitive element may be used for the main reactance circuit 13 (63) so as to be a capacitive reactance, while an inductive element may be used for the sub-reactance circuit 30 (80) so as to be an inductive reactance.

Figure 7:
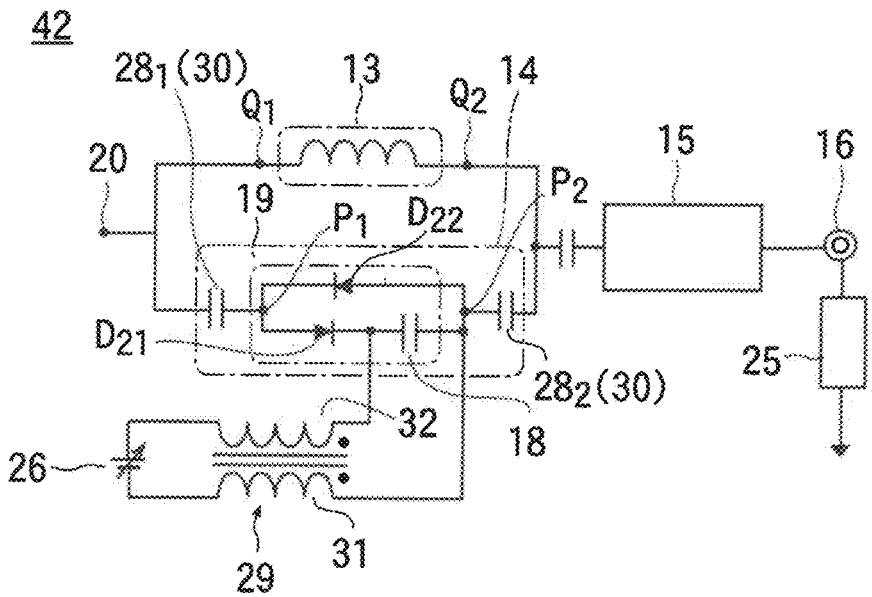
FIG. 7 is a detailed circuit diagram (3) of the first exemplary circuit of the present embodiment.
Figure 8:
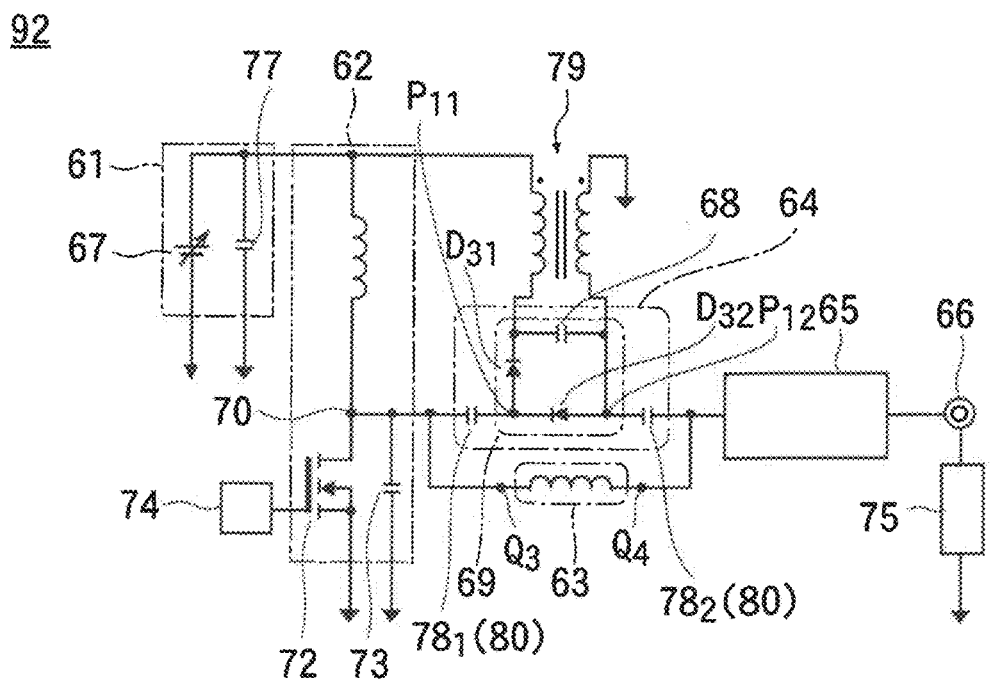
FIG. 8 is a detailed circuit diagram (3) of the second exemplary circuit of the present embodiment.
Figure 9:
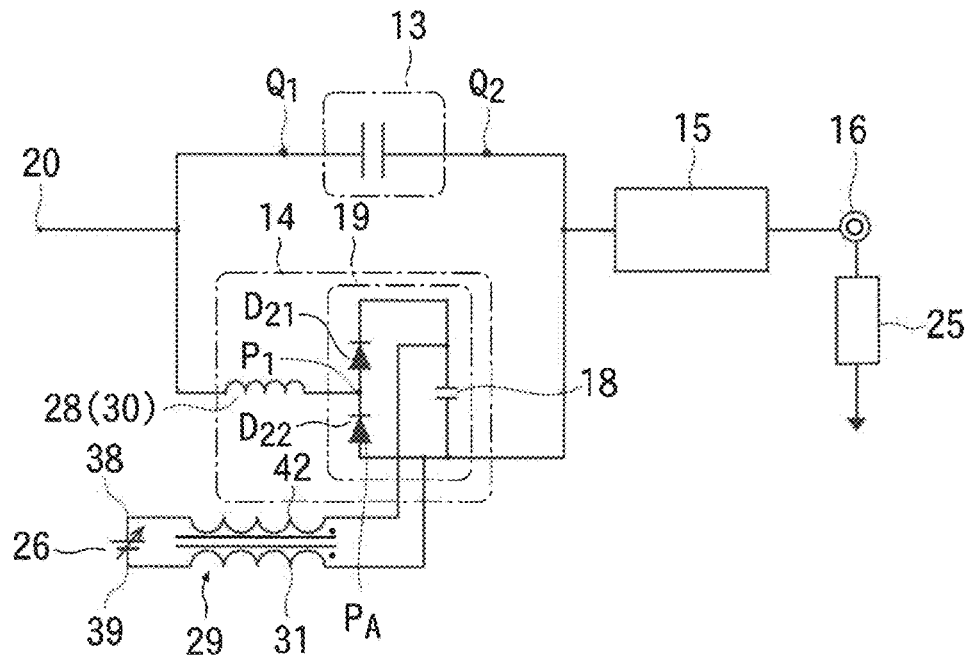
FIG. 9 is a detailed circuit diagram (4) of the first exemplary circuit of the present embodiment.
Figure 10:
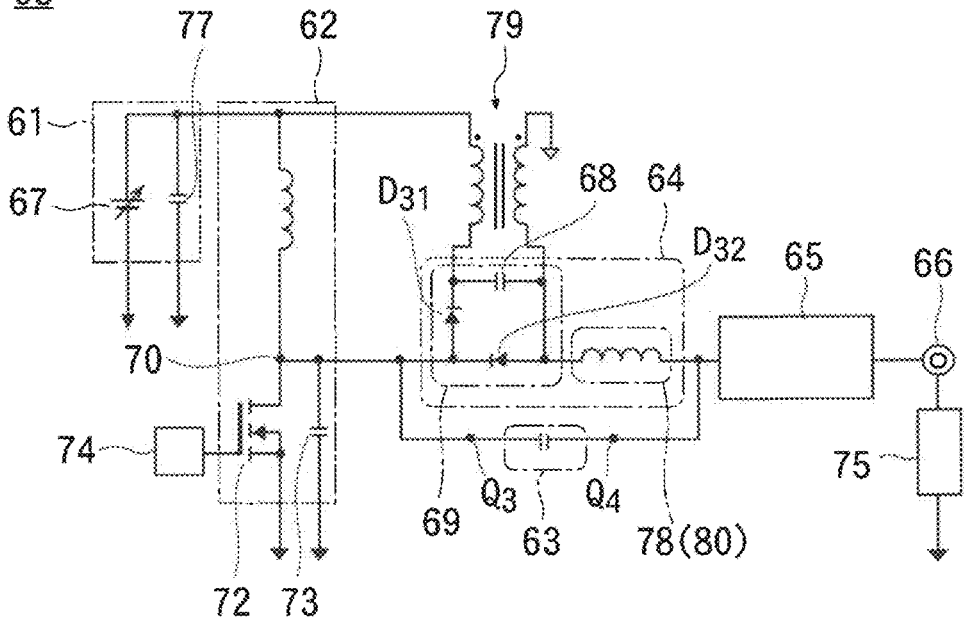
FIG. 10 is a detailed circuit diagram (4) of the second exemplary circuit of the present embodiment.
Figure 11:
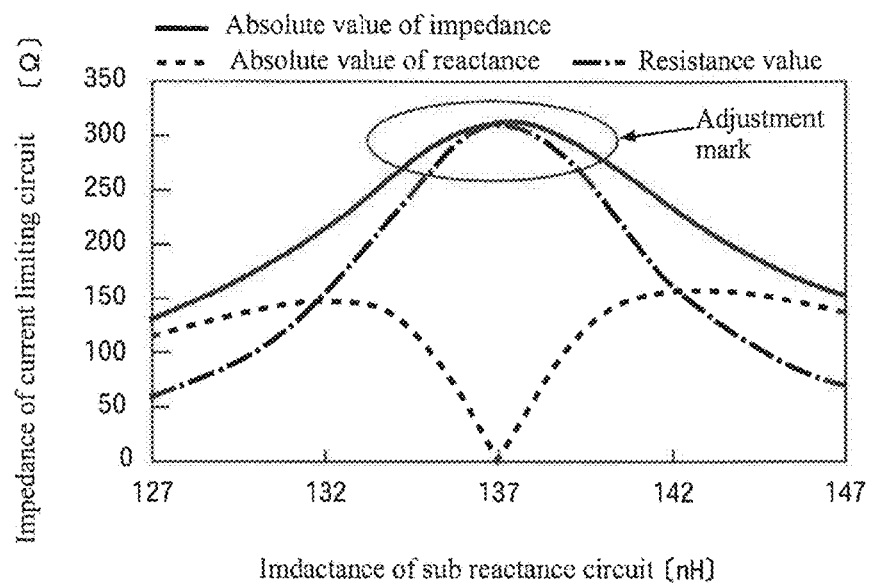
FIG. 11 is a graph for illustrating a relationship between an inductance value of a sub-reactance circuit and an impedance value of a high frequency current limiting circuit.
Figure 12:
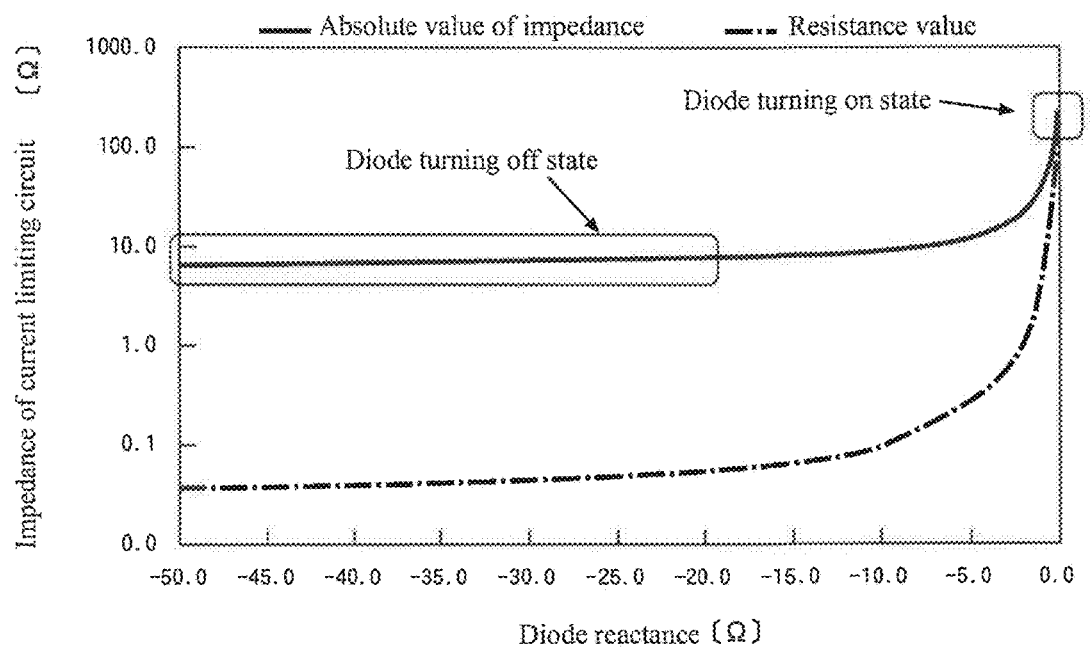
FIG. 12 is a graph illustrating the dependence of the impedance value of the high frequency current limiting circuit on the reactance values of a diode element of a protection circuit.
Figures 14A, 14B:
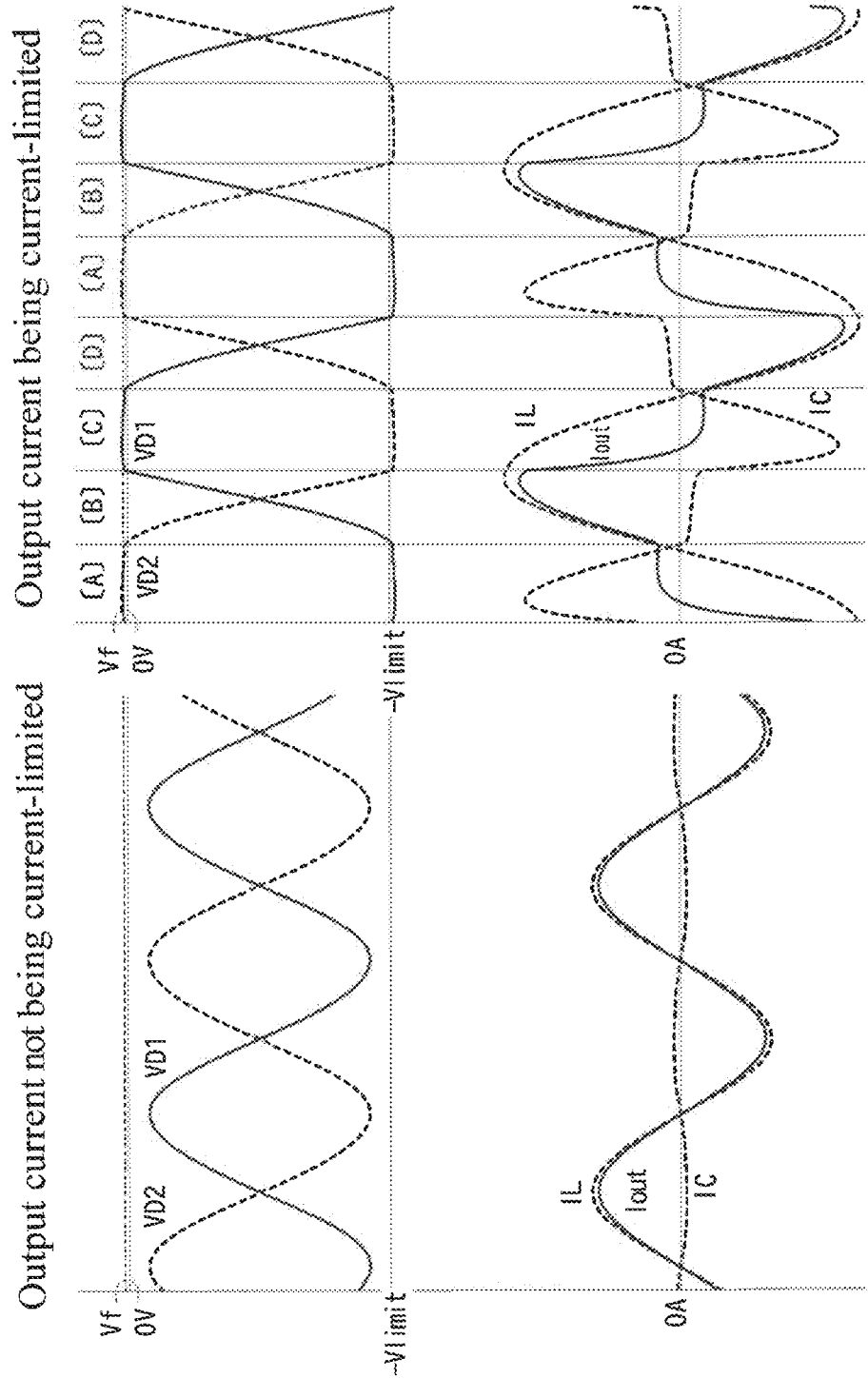
FIG. 14(a) illustrates a relationship between the output current being current-limited and the output current not being current-limited.
FIG. 14(b) illustrates a relationship between the output current being current-limited and the output current not being current-limited.
Figure 15:
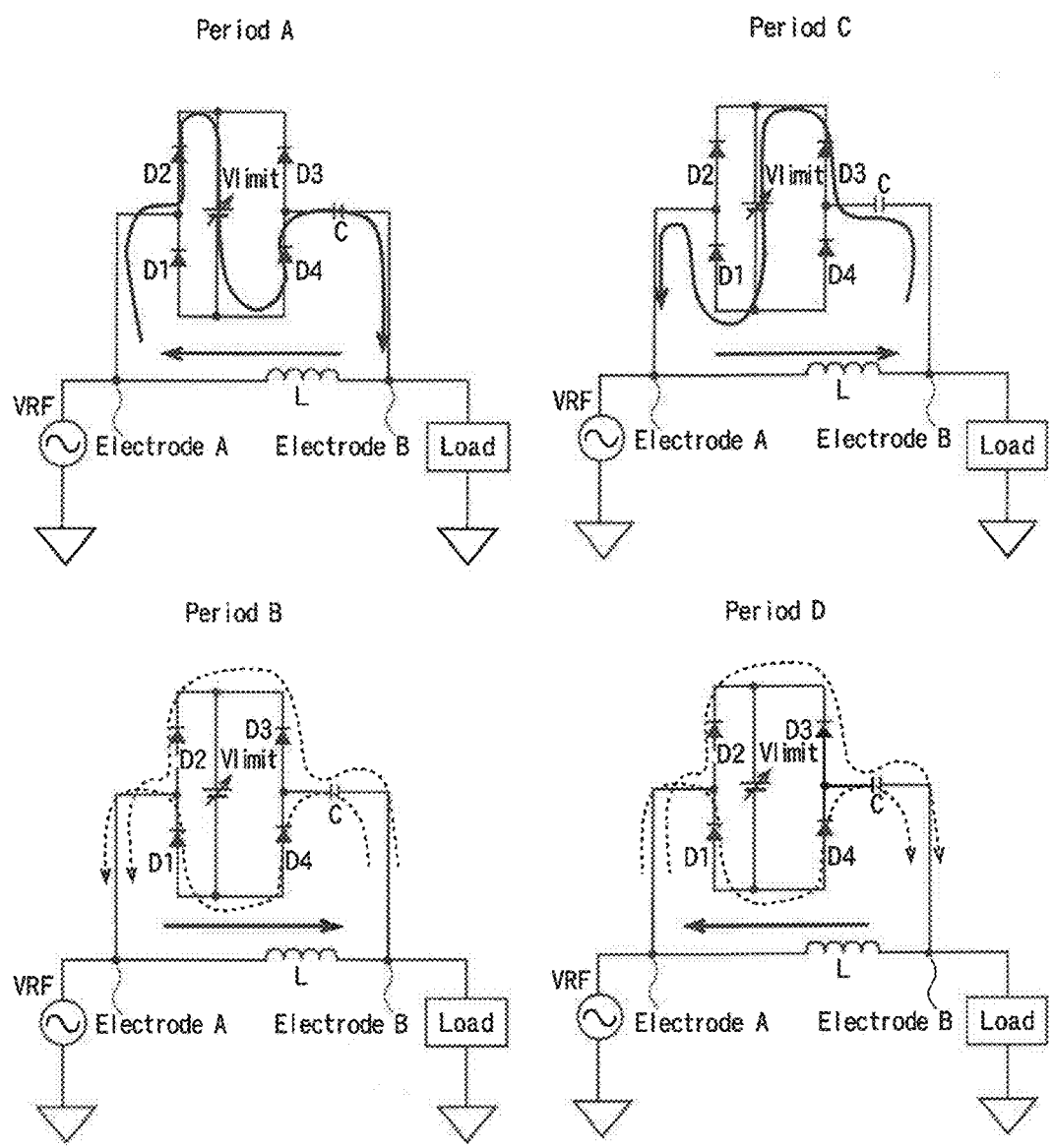
FIG. 15 illustrates the direction of the current flowing during each of periods A to D.
Figure 16:
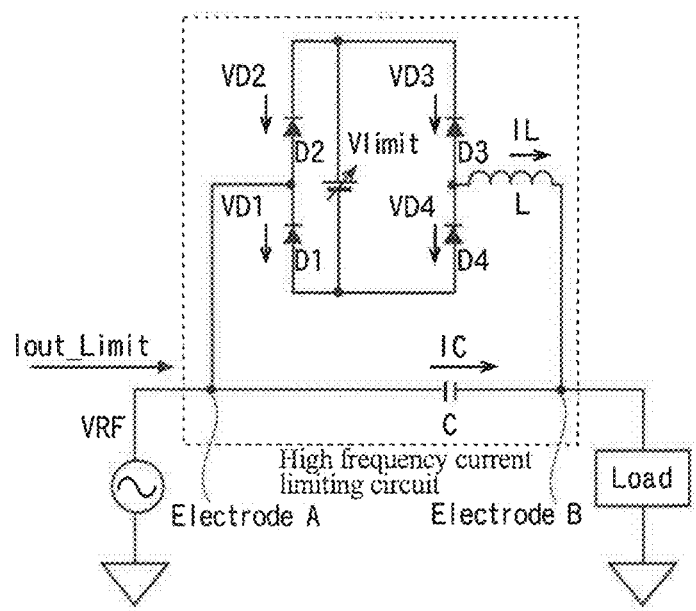
FIG. 16 illustrates an example when a main reactance circuit is capacitive and a sub-reactance circuit is inductive.
Figures 17A, 17B:
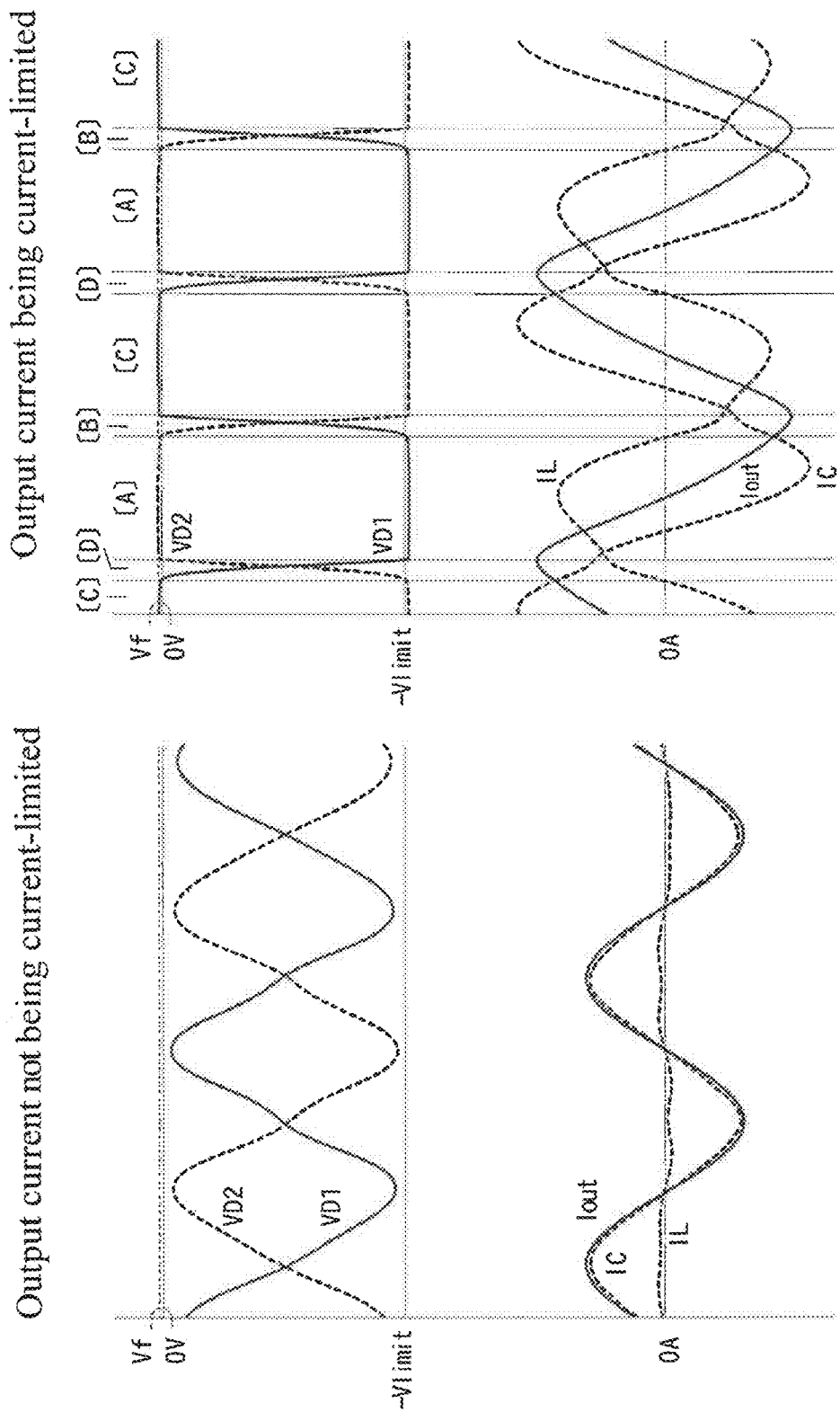
FIG. 17(a) is a graph illustrating a state being current-limited.
FIG. 17(b) is a graph illustrating a state not being current-limited.
Figure 18:
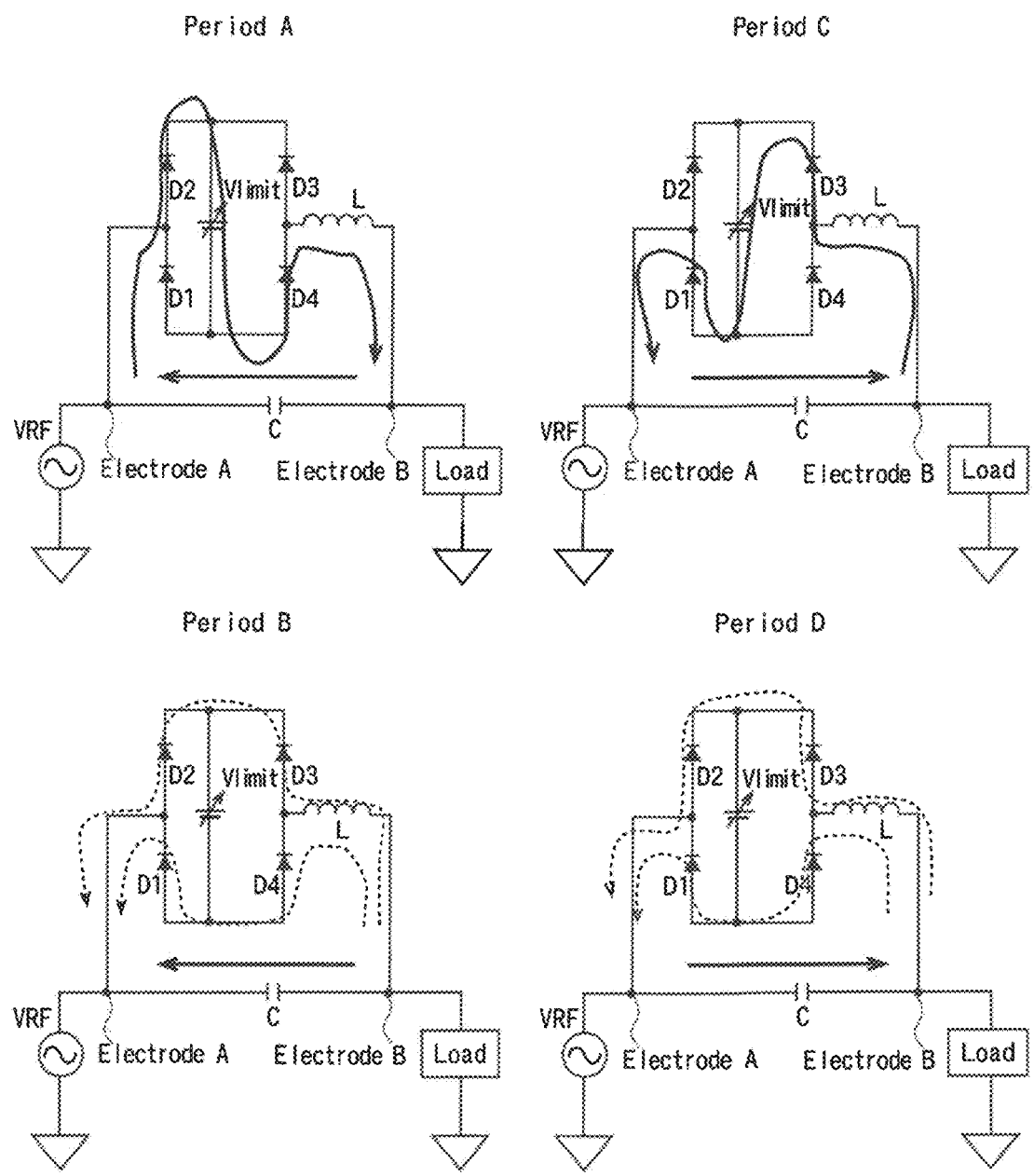
FIG. 18 illustrates the current during each of the periods A to D in current limiting.
Figure 19:
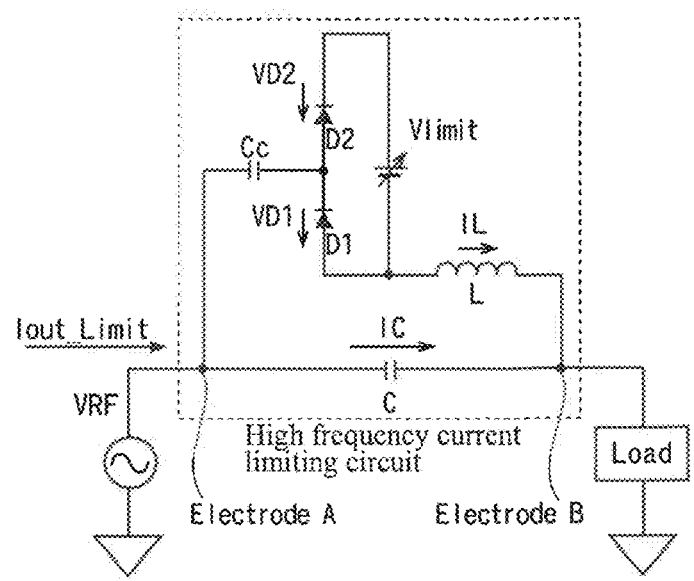
FIG. 19 illustrates a half-wave voltage doubler rectifying circuit.
Figures 20A, 20B:
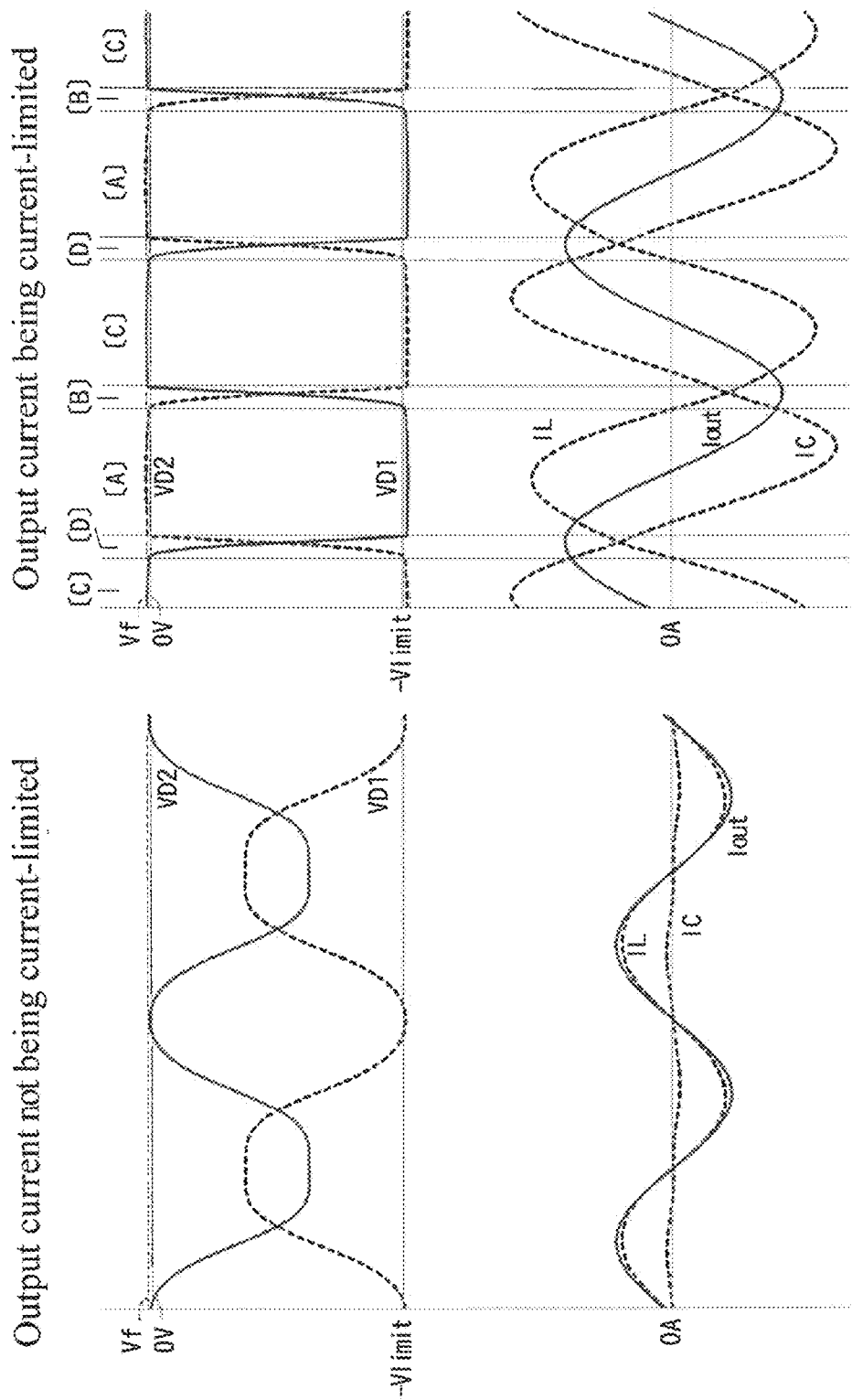
FIG. 20(*a*) illustrates how currents flow.
Figure 21:
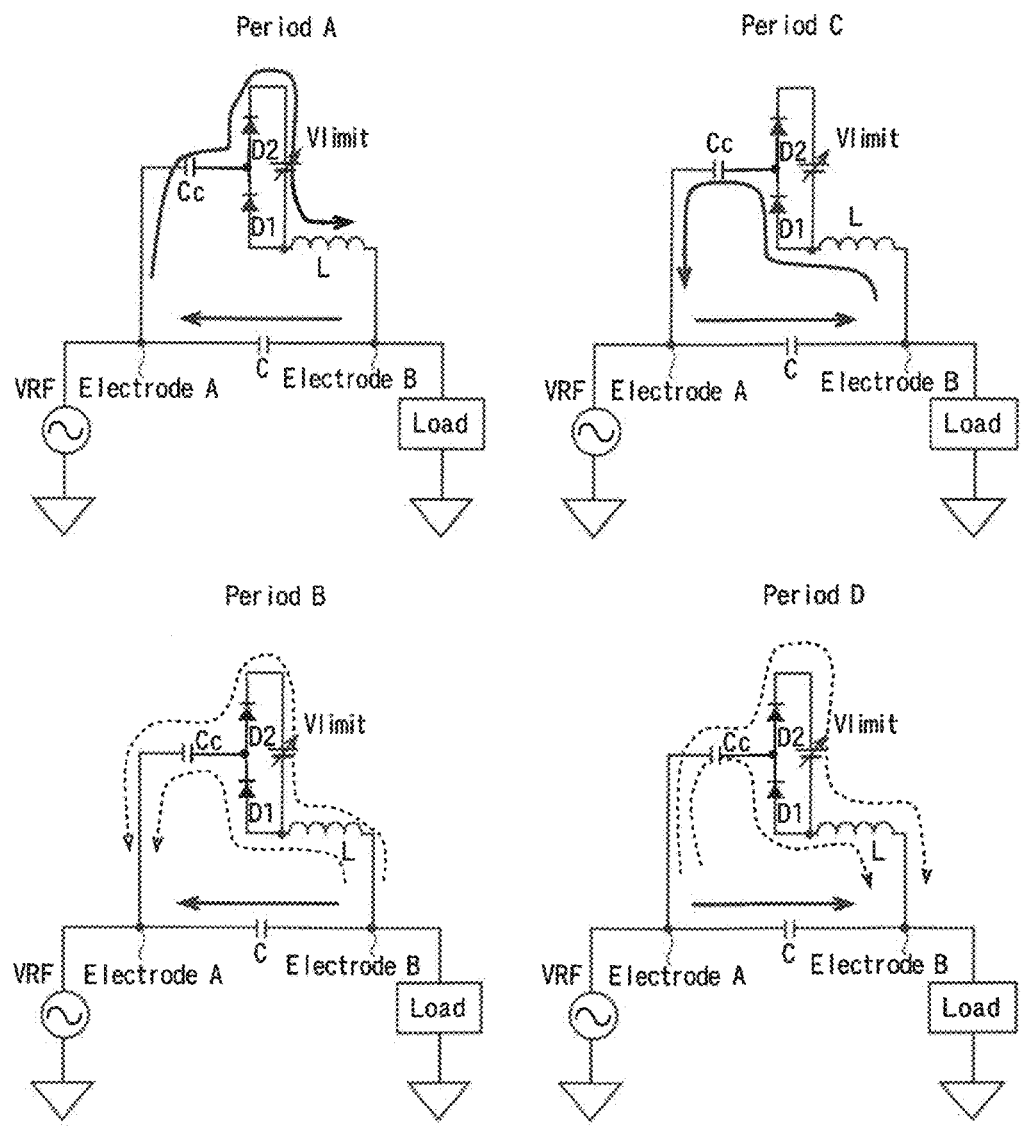
FIG. 21 illustrates the direction of the current flowing during each of the periods A to D.
Figure 22:
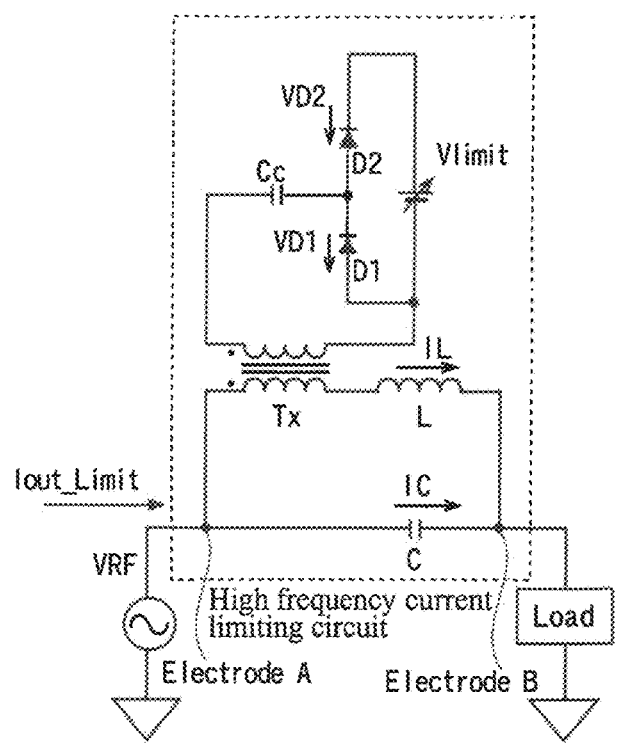
FIG. 22 illustrates a transformer-coupled half-wave voltage doubler rectifying circuit.
Figures 23A, 23B:
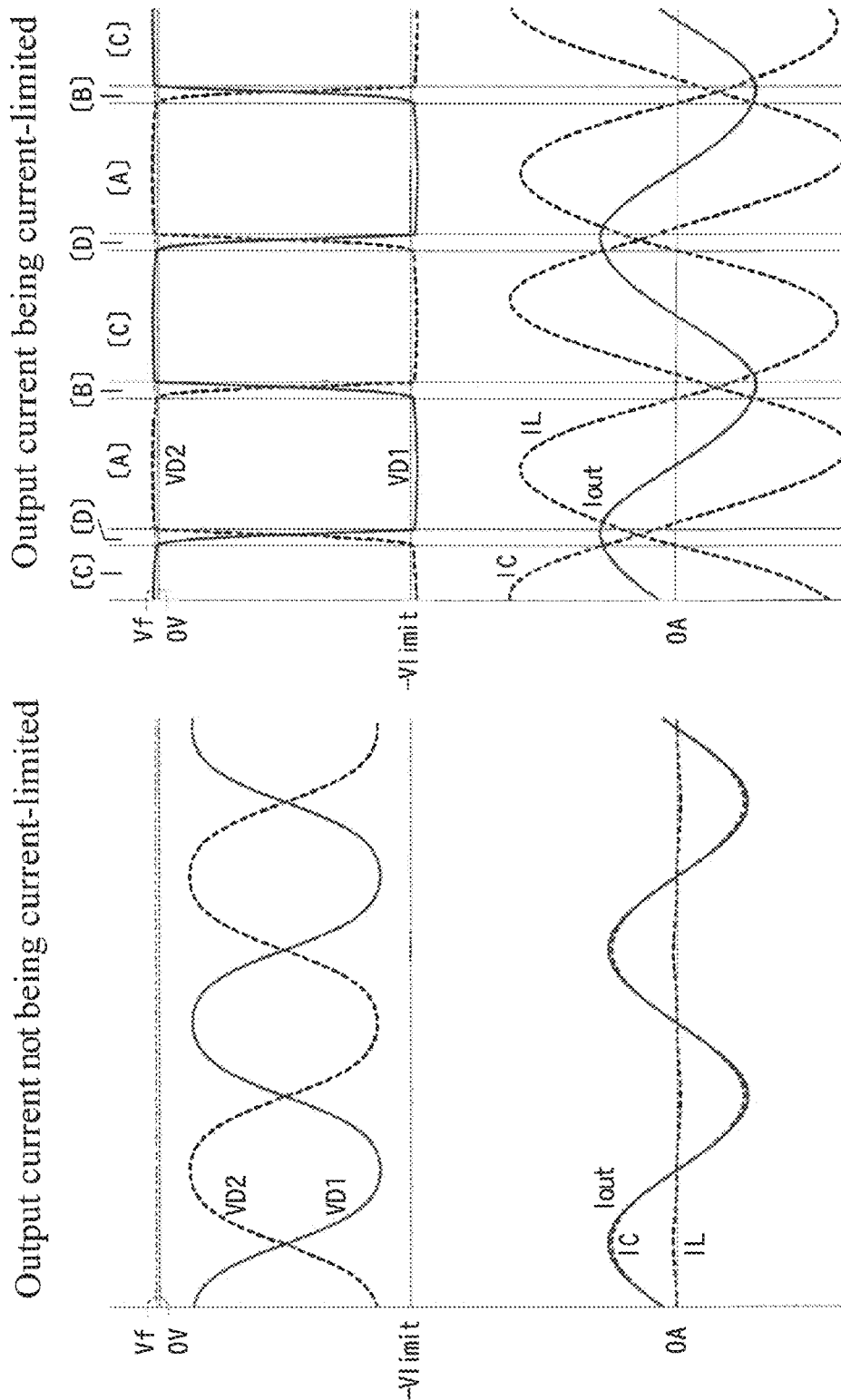
FIG. 23(*a*) illustrates how currents flow in the transformer-coupled rectifying circuit.
Figure 24:
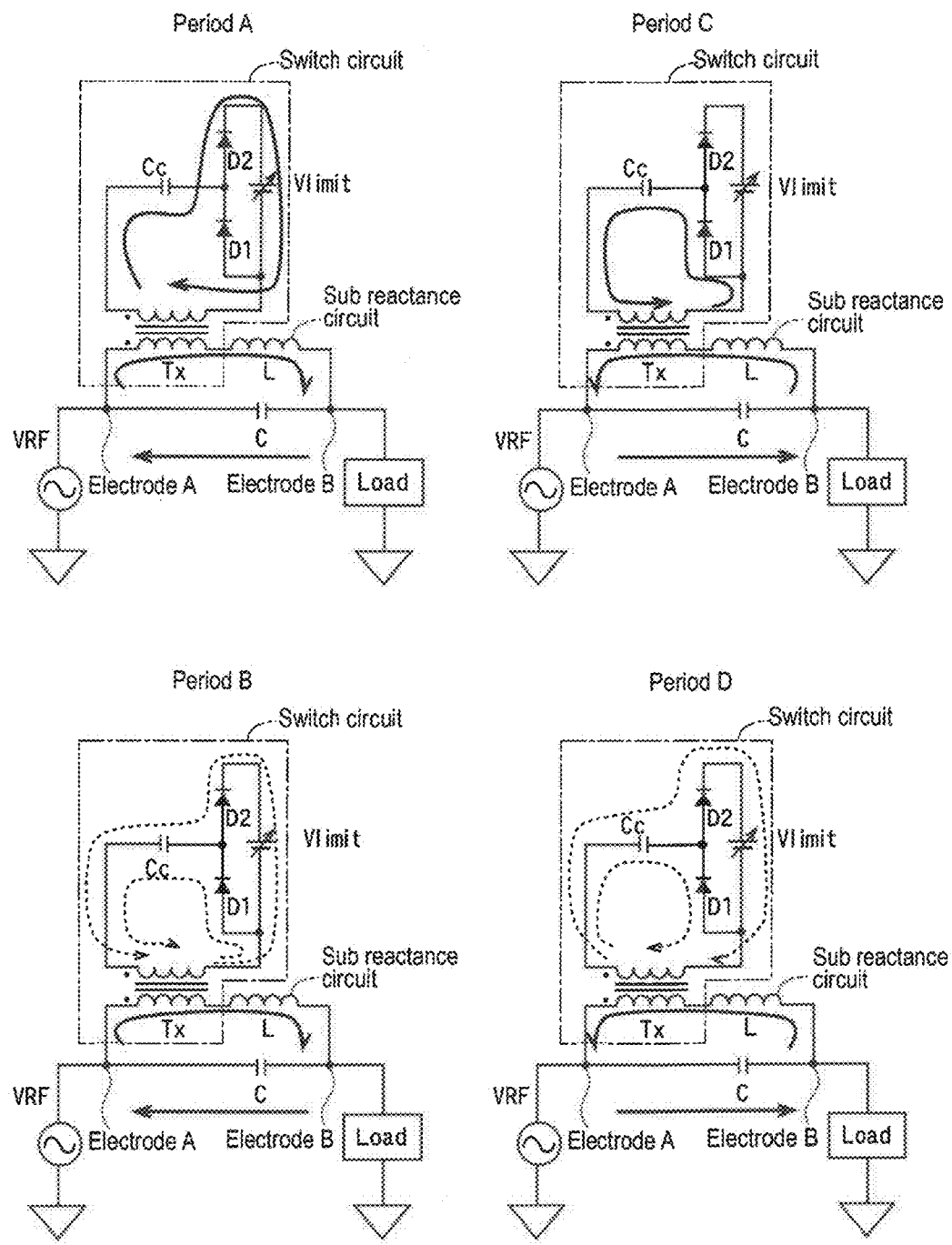
FIG. 24 illustrates the direction of the current flowing during each of the periods A to D.
Figure 25:
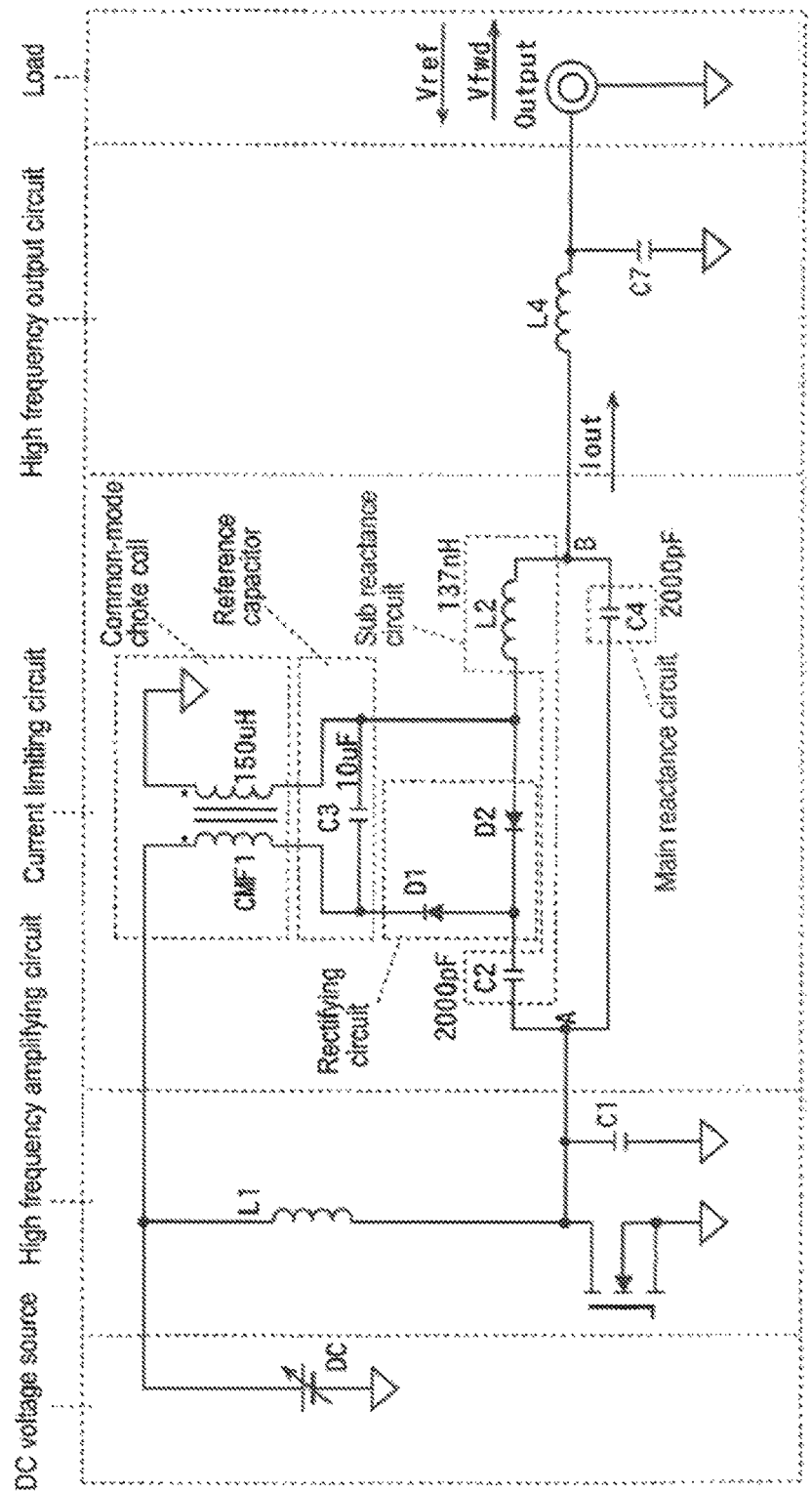
FIG. 25 illustrates a first exemplary circuit when a class-E amplifying circuit is applied to a high frequency amplifying circuit.
Figure 26:
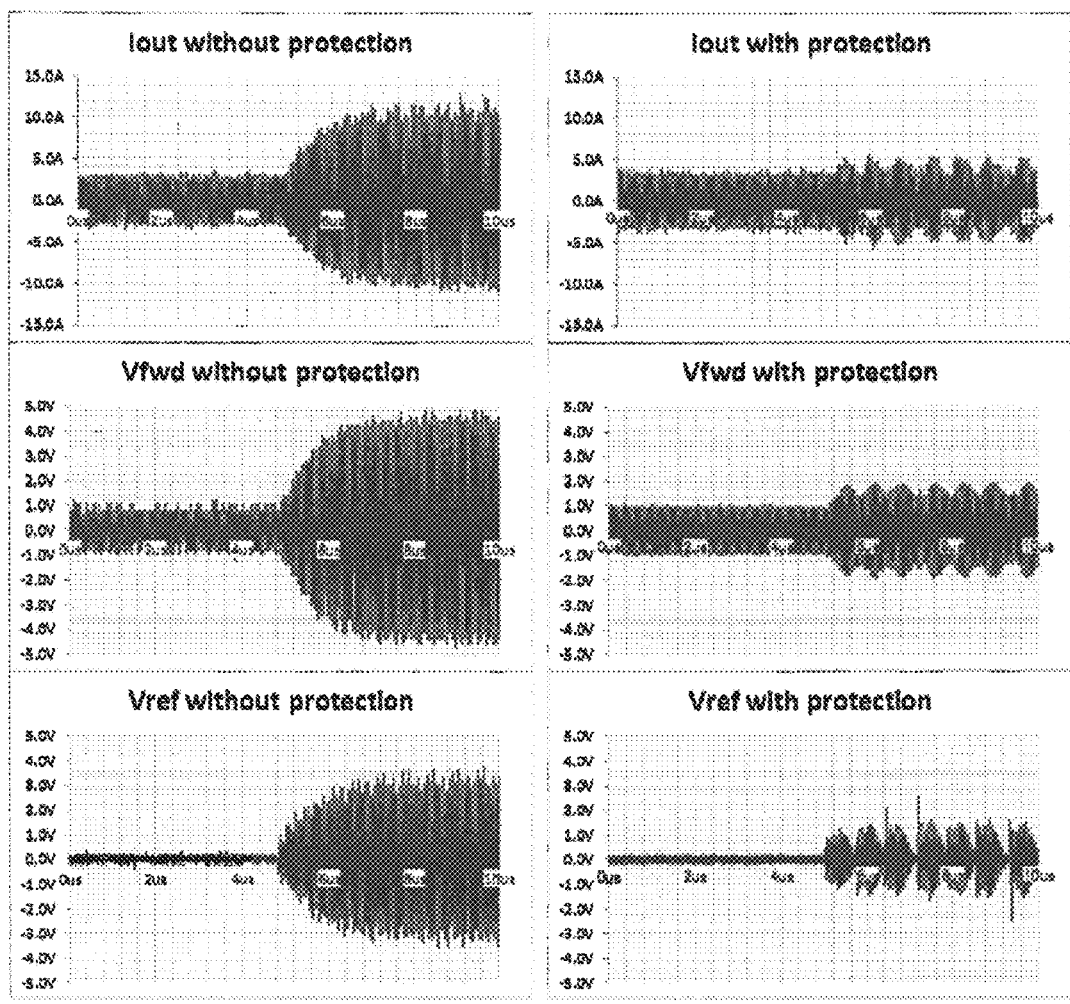
FIG. 26 illustrates how currents flow.
Figure 27:
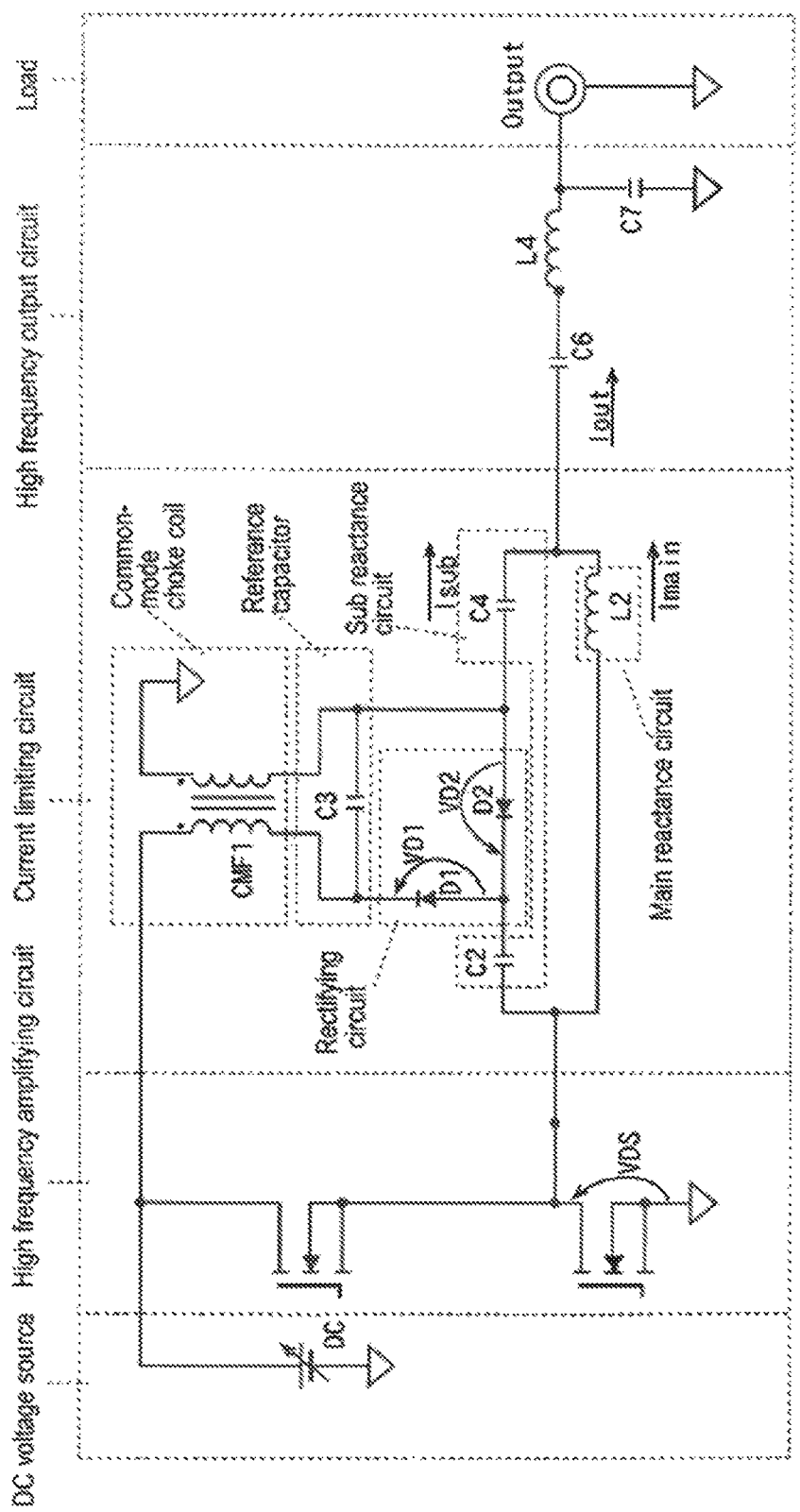
FIG. 27 illustrates a second exemplary circuit when a class-D amplifying circuit is applied to a high frequency amplifying circuit.
Figure 28:
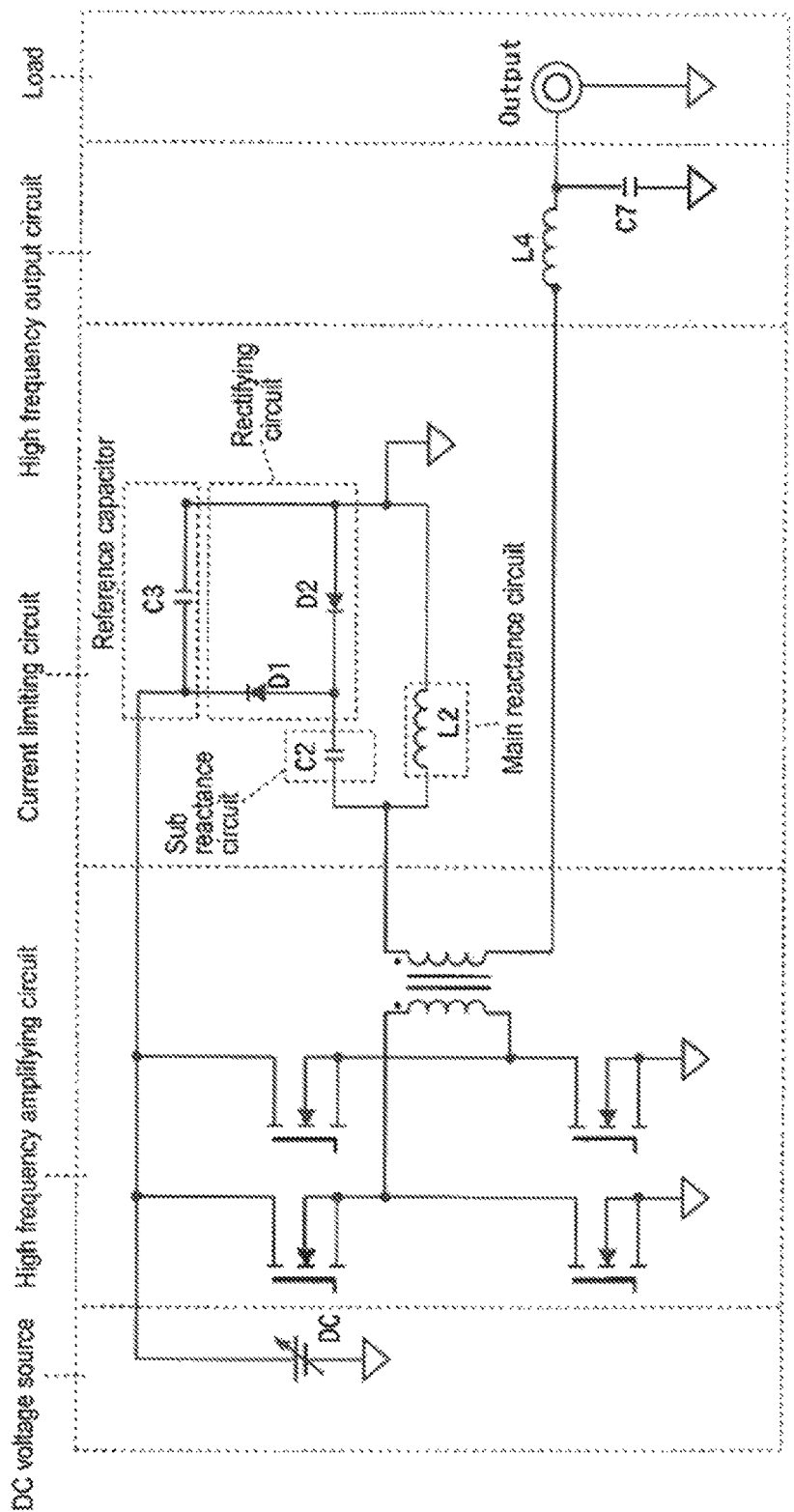
FIG. 28 illustrates a third exemplary circuit when a class-D amplifying circuit is applied to a high frequency amplifying circuit.
Figure 29:
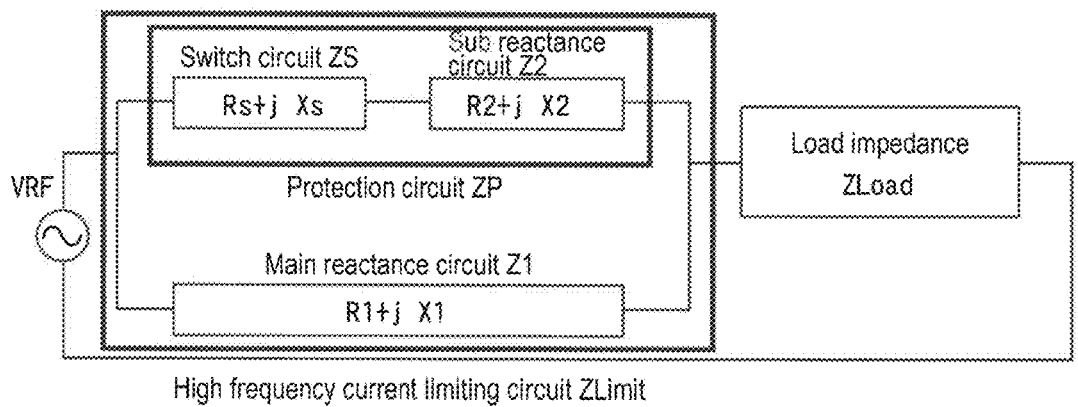
FIG. 29 illustrates internal impedances.

Next, in a power supply device 42 (92) of FIG. 7 (FIG. 8), a switch circuit 19 (69) includes the reference capacitance element 18 (68), a fifth diode element $D_{21}$ ($D_{31}$) connected in series to the reference capacitance element 18 (68), and a sixth diode element $D_{22}$ ($D_{32}$) connected in parallel to a circuit formed by series connecting the reference capacitance element 18 (68) and fifth diode element $D_{21}$ ($D_{31}$).

In this switch circuit 19 (69), a first sub-reactance element $28_1$ ($78_1$) having an inductive reactance and a second sub-reactance element $28_2$ ($78_2$) having an inductive reactance are connected in series. The reference capacitance element 18 (68) is charged by the auxiliary power source 26 or the DC power source 61 so that the potential difference between the both ends of the capacitance element 18 becomes a predetermined reference voltage.

Here, a terminal on the high frequency amplifying circuit 12 (62) side is charged so as to have a higher voltage than a terminal on the load 25 (75) side. The cathode terminal of the fifth diode element $D_{21}$ ($D_{31}$) connected in series to the reference capacitance element 18 (68) faces the load 25 (75) side, while the anode terminal thereof faces the high frequency amplifying circuit 12 (62).

When the switch circuit 19 (69) is in a turning on state, a voltage equal to or higher than the reference voltage will not be applied to the both ends of the switch circuit 19 (69), and thus, the switch circuit 16 (69) will not turn on.

When the current flowing through the main reactance circuit 13 (63) and the voltage applied thereto increase due to a rapid change of the impedance of the load 25 (75), the voltage between the first connection point $P_1$ ($P_{11}$) and the second connection point $P_2$ ($P_{12}$) of the switch circuit 19 (69) will increase as well. Here, if this voltage becomes equal to or higher than a voltage obtained by adding the forward turning on voltage of the fifth diode element $D_{21}$ ($D_{31}$) to the reference voltage, the fifth diode element $D_{21}$ ($D_{31}$) is forward-biased, the reference capacitance element 18 (68) and the fifth diode element $D_{21}$ ($D_{31}$) turn on, and the turning on current flows into the protection circuit 14 (64).

At this time, the high frequency amplifying circuit 12 (62) is connected to the load 25 (75) through an impedance of the circuit formed by connecting the main reactance circuit 13 (63) and the protection circuit 14 (64) in parallel.

The absolute value of an impedance of the circuit formed by parallel connecting the main reactance circuit 13 (63) and the protection circuit 14 (64) is set in a manner such that the absolute value of an impedance of the switch circuit 16 (69) in a turning on state becomes larger than the absolute value of an impedance of the switch circuit 16 (69) in a turning off state. As the result, the current output from the high frequency amplifying circuit 12 (62) is limited, and thus, the semiconductor switch 22 (72) is protected.

In the power supply device 42 (92) shown in FIG. 7 (FIG. 8), an inductance element is used for the main reactance circuit 13 (63), the sub-reactance elements $28_1$, $28_2$ ($78_1$, $78_2$) are used for the sub-reactance circuit 30 (80), and the main reactance circuit 13 (63) is an inductive reactance and the sub-reactance circuit 30 (80) is a capacitive reactance. However, as shown in a power supply device 43 (93) of FIG. 9 (FIG. 10), a capacitance element may be used for the main reactance circuit 13 (63), an inductance element may be used for the sub-reactance element 28 (78) of the sub-reactance circuit 30 (80), the main reactance circuit 13 (63) may have a capacitive reactance, and the sub-reactance circuit 30 (80) may be an inductive reactance.

Moreover, a sub-primary winding may be electrically connected between the high frequency amplifying circuit 12 (62) and the output terminal 16 (66) for supplying a current to the load 25 (75). The protection circuit 14 (64) may be provided in a sub-secondary winding magnetically coupled with the sub-primary winding.

REFERENCE SIGNS LIST 10, 41 to 45, 60, 91 to 95 power supply device
11, 61 DC power source
12, 62 high frequency amplifying circuit
13, 63 main reactance circuit
14, 64 protection circuit
16, 66 output terminal
18, 68 reference capacitance element
19, 69 switch circuit
21, 71 output inductance circuit
25, 75 load
30, 80 sub-reactance circuit
$D_{01}$ to $D_{04}$, $D_{11}$ to $D_{14}$, $D_{21}$, $D_{31}$ diode element
$CD_{01}$ to $CD_{04}$ or $CD_{11}$ to $CD_{14}$, $CD_{21}$, $CD_{31}$ parasitic capacitance of diode element
L Coil
C Capacitor

What is claimed is:

1. A power supply device comprising:
a DC power source configured to output a DC voltage;
a high frequency amplifying circuit configured to generate a high frequency current by repeatedly turning on and turning off a semiconductor switch connected to the DC power source;
a high frequency output circuit configured to supply the high frequency current to a load;
a main reactance circuit having a predetermined reactance value, the main reactance circuit having a first end connected to the high frequency amplifying circuit and a second end connected to the high frequency output circuit;
a protection circuit connected in parallel to the main reactance circuit between the high frequency amplifying circuit and the high frequency output circuit, the protection circuit including:
a DC voltage source configured to supply a predetermined reference voltage;
a switch circuit configured to turn on when a turning on voltage larger than the predetermined reference voltage is applied, the switch circuit including:
a reference capacitance element to be charged by the reference voltage; and
a diode element to be reverse-biased by a charged voltage of the reference capacitance element; and
a sub-reactance circuit having a predetermined reactance value, wherein:
an absolute value of an impedance of a parallel connection circuit of the protection circuit and the main reactance circuit, when the switch circuit is turned on, is set to be larger than an absolute value of an impedance of the parallel connection circuit of the protection circuit and the main reactance circuit when the switch circuit is turned off,
once the switch circuit is turned on, an absolute value of an impedance on a load side of the high frequency amplifying circuit becomes larger than an absolute value of an impedance when the protection circuit is turned off, so that the high frequency current is limited, and
the turning on voltage is applied to the switch circuit, the diode element is forward-biased to turn on, and the switch circuit is then turned on.

2. The power supply device according to claim 1, wherein among an inductive reactance and a capacitive reactance, a reactance value of the main reactance circuit is set to a value of either one of the inductive reactance and the capacitive reactance, while the sub-reactance circuit is set to a value of the other one of the inductive reactance and the capacitive reactance.

3. The power supply device according to claim 1, further comprising an auxiliary power source, wherein the reference capacitance element is charged by the auxiliary power source.

4. The power supply device according to claim 1, wherein the reference capacitance element is charged by the DC power source.

* * * * *